(12) United States Patent
Oh et al.

(10) Patent No.: US 10,985,206 B2
(45) Date of Patent: Apr. 20, 2021

(54) CHIP-SCALE PACKAGE LIGHT EMITTING DIODE

(71) Applicant: Seoul Viosys Co., Ltd., Ansan-si (KR)

(72) Inventors: Se Hee Oh, Ansan-si (KR); Jong Kyu Kim, Ansan-si (KR); Joon Sub Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/284,468

(22) Filed: Feb. 25, 2019

(65) Prior Publication Data

US 2019/0189680 A1 Jun. 20, 2019

Related U.S. Application Data

(63) Continuation of application No. PCT/KR2017/009562, filed on Aug. 31, 2017.

(30) Foreign Application Priority Data

Sep. 5, 2016 (KR) .................... 10-2016-0114057
Nov. 7, 2016 (KR) .................... 10-2016-0147563

(51) Int. Cl.
*H01L 27/15* (2006.01)
*H01L 33/62* (2010.01)
*H01L 33/40* (2010.01)
H01L 33/00 (2010.01)
H01L 33/38 (2010.01)

(52) U.S. Cl.
CPC ............ *H01L 27/15* (2013.01); *H01L 33/405* (2013.01); *H01L 33/62* (2013.01); *H01L 27/153* (2013.01); *H01L 33/0016* (2013.01); *H01L 33/38* (2013.01); *H01L 2933/0066* (2013.01)

(58) Field of Classification Search
CPC ..... H01L 33/00–648; H01L 27/15–156; H01L 2933/00–0091; H01L 33/38–387
See application file for complete search history.

(56) References Cited

U.S. PATENT DOCUMENTS

| | | |
|---|---|---|
| 8,823,031 B2 | 9/2014 | Kususe et al. |
| 9,412,903 B2 | 8/2016 | Yoon et al. |
| 2013/0049053 A1 | 2/2013 | Kususe et al. |

(Continued)

FOREIGN PATENT DOCUMENTS

| | | |
|---|---|---|
| JP | 2014-044971 | 3/2014 |
| JP | 10-2015-0087445 | 7/2015 |
| KR | 10-2013-0030178 | 3/2013 |

(Continued)

OTHER PUBLICATIONS

International Search Report dated Jan. 12, 2016, in International Application No. PCT/KR2017/009562 (with English Translation).

*Primary Examiner* — Tucker J Wright
(74) *Attorney, Agent, or Firm* — H.C. Park & Associates, PLC

(57) ABSTRACT

A chip-scale package type light emitting diode is provided. In the light emitting diode according to one embodiment, an opening exposing a pad metal layer is separated from an opening of a lower insulation layer which exposes an ohmic reflection layer formed on a mesa. Therefore, it is possible to prevent solder, particularly Sn, from diffusing and contaminating the ohmic reflection layer.

9 Claims, 18 Drawing Sheets

(56) References Cited

U.S. PATENT DOCUMENTS

2015/0207051 A1   7/2015  Yoon et al.
2015/0349207 A1* 12/2015  Sogo ................... H01L 33/0093
                                                        257/99

FOREIGN PATENT DOCUMENTS

KR    10-2015-0114353    2/2015
KR    10-2016-0016361    2/2016

* cited by examiner

CHIP-SCALE PACKAGE LIGHT EMITTING DIODE

CROSS-REFERENCE TO RELATED APPLICATIONS

This application is a Continuation of International Patent Application No. PCT/KR2017/009562, filed on Aug. 31, 2017, and claims priority to and benefit of Korean Patent Application No. 10-2016-0114057, filed on Sep. 5, 2016, and Korean Patent Application No. 10-2016-0147563, filed on Nov. 7, 2016, all of which are hereby incorporated by reference for all purposes as if fully set forth herein.

BACKGROUND

Field

Exemplary embodiments of the inventive concepts relate to a light emitting diode, more specifically to a chip-scale package type light emitting diode.

Discussion of the Background

In general, with good thermal stability and a direct transition type energy band structure, Group III-based nitrides, such as gallium nitride (GaN), aluminum nitride (AlN), and the like, have been identified as materials for light sources in the visible range and the ultraviolet range. In particular, blue and green light emitting diodes using indium gallium nitride are used in various fields including large full color flat panel displays, signal lamps, interior lighting, high density light sources, high resolution output systems, optical communication, and the like.

In recent years, research has been conducted on a chip-scale package type light emitting diode in which a packaging process is performed at a chip level. Since these light emitting diodes are smaller in size than standard packages and do not require a separate packaging process, manufacturing processes can further be simplified, and time and cost can be saved.

The chip-scale package type light emitting diode has a flip-chip shape electrode structure in general, and thus has excellent heat dissipation characteristics. However, since the chip-scale package type light emitting diode is generally manufactured to have the flip-chip shape electrode structure, there is a problem that a structure of the light emitting diode is considerably complicated in order to prevent diffusion of solder used in flip bonding. Nevertheless, solder, particularly Sn, may diffuse into the light emitting diode to contaminate an ohmic reflection layer and cause a failure of the light emitting diode.

Accordingly, it would be desirable to provide a reliable light emitting diode while simplifying the structure of the light emitting diode.

The above information disclosed in this Background section is only for understanding of the background of the inventive concepts, and, therefore, it may contain information that does not constitute prior art.

SUMMARY

Exemplary embodiments of the inventive concepts provide a light emitting diode capable of effectively preventing diffusion of a bonding material such as solder without complicating a structure of the light emitting diode, thereby improving reliability.

Exemplary embodiments of the inventive concepts provide a light emitting diode capable of effectively preventing diffusion of the solder within a limited design range.

Exemplary embodiments of the inventive concepts provide a light emitting diode capable of preventing diffusion of the solder in the light emitting diode including a plurality of light emitting cells.

In accordance with one exemplary embodiment of the inventive concepts, a light emitting diode comprises: a substrate; a first conductivity type semiconductor layer disposed on the substrate; a mesa disposed on the first conductivity type semiconductor layer, and including an active layer and a second conductivity type semiconductor layer; an ohmic reflection layer disposed on the mesa and electrically connected to the second conductivity type semiconductor layer; a lower insulation layer covering the mesa and the ohmic reflection layer, and including a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer, and electrically connected to the ohmic reflection layer through the second opening; and an upper insulation layer covering the first pad metal layer and the second pad metal layer, and including a first opening exposing the first pad metal layer and a second opening exposing the second pad metal layer, wherein the second opening of the upper insulation layer is separated from the second opening of the lower insulation layer.

Since the second opening of the upper insulation layer is separated from the second opening of the lower insulation layer, it is possible to prevent the solder from diffusing into the ohmic reflection layer.

Furthermore, a shortest distance from the second opening of the lower insulation layer to the second opening of the upper insulation layer may be greater than a shortest distance from the second opening of the lower insulation layer to an edge of the second pad metal layer. The upper insulation layer and the lower insulation layer prevent diffusion of the solder, but the solder may reach the second opening of the lower insulation layer along an interface of the lower insulation layer and the second pad metal layer. Therefore, by spacing the second opening of the lower insulation layer away from the second opening of the upper insulation layer within the limited design range, a diffusion path of the solder may be increased, thereby preventing defects due to diffusion of the solder.

Meanwhile, the first opening of the lower insulation layer may expose the first conductivity type semiconductor layer along a periphery of the mesa, and the first pad metal layer may have an outer contact portion contacting the first conductivity type semiconductor layer along the periphery of the mesa. The first pad metal layer contacts the first conductivity type semiconductor layer along the periphery of the mesa, so that current spreading capability of the light emitting diode may be improved.

In addition, the mesa may comprise an indent portion to expose the first conductivity type semiconductor layer, and the first opening of the lower insulation layer may further expose the first conductivity type semiconductor layer in the indent portion. Furthermore, the first pad metal layer may further comprise an inner contact portion contacting the first conductivity type semiconductor layer in the indent portion. Since the first pad metal layer contacts the first conductivity type semiconductor layer at the periphery of the mesa and inside the mesa, current spreading capability of the light emitting diode is further enhanced.

Furthermore, the inner contact portion may be connected to the outer contact portion, but the present disclosure is not limited thereto, the inner contact portion and the outer contact portion may be separated from each other.

Meanwhile, the second opening of the lower insulation layer may have a convex shape on a side facing the second opening of the upper insulation layer, and the second opening of the upper insulation layer may have a concave shape corresponding to the convex shape of the second opening of the lower insulation. The second opening of the lower insulation layer may have a smaller size than the second opening of the upper insulation layer. Therefore, it is advantageous for patterning that the lower insulation layer has the convex shape. In addition, the second opening of the upper insulation layer has the concave portion so that a distance from the second opening of the lower insulation layer to the second opening of the upper insulation layer may be increased.

In some embodiments, the first and second pad metal layers exposed through the first and second openings of the upper insulation layer may be bonding pads to which the solder is directly bonded. Therefore, the solder contacts upper surfaces of first and second pad electrode layers exposed through the openings of the upper insulation layer.

In other embodiments, the light emitting diode further comprises first and second bump pads that cover the first and second pad metal layers exposed through the first and second openings of the upper insulation layer, respectively. By adopting the first and second bump pads, the diffusion path of the solder may be made long.

Furthermore, the first and second bump pads may cover and seal the first and second openings of the upper insulation layer, respectively. Accordingly, it is possible to prevent the solder from directly contacting the first and second pad metal layers.

Meanwhile, the second bump pad may also cover an upper insulation layer on an upper portion of the second opening of the lower insulation layer.

A light emitting diode in accordance with another exemplary embodiment comprises: a substrate; a first light emitting cell and a second light emitting cell disposed adjacent to each other on the substrate, and each comprising a first conductivity type semiconductor layer, a second conductivity type semiconductor layer, and an active layer disposed between the first conductivity type semiconductor layer and the second conductivity type semiconductor layer; ohmic reflection layers disposed on the second conductivity type semiconductor layers of the first light emitting cell and the second light emitting cell, respectively; a lower insulation layer covering the first light emitting cell, the second light emitting cell and ohmic reflection layers, and including first openings for exposing the first conductivity type semiconductor layers of the first and second light emitting cells and second openings for exposing the ohmic reflection layers; a first pad metal layer disposed on the lower insulation layer and electrically connected to the first conductivity type semiconductor layer of the first light emitting cell through the first opening on the first light emitting cell; a second pad metal layer disposed on the lower insulation layer and electrically connected to the ohmic reflection layer on the second light emitting cell through the second opening on the second light emitting cell; and an upper insulation layer having a first opening exposing the first pad metal layer and a second opening exposing the second pad metal layer, wherein the second opening of the upper insulation layer is separated from the second openings of the lower insulation layer.

Accordingly, it is possible to provide the light emitting diode capable of preventing diffusion of solder in the light emitting diode including a plurality of light emitting cells Furthermore, a shortest distance from the second opening of the lower insulation layer on the second light emitting cell to the second opening of the upper insulation layer on the second light emitting cell may be greater than a shortest distance from the second opening of the lower insulation layer on the second light emitting cell to an edge of the second pad metal layer. Therefore, diffusion of the solder may be effectively prevented within a limited design range.

Meanwhile, the light emitting diode may further comprise a connection metal layer disposed on the lower insulation layer, and electrically connected to the ohmic reflection layer on the first light emitting cell through the second opening of the first light emitting cell, and electrically connected to the first conductivity type semiconductor layer of the second light emitting cell through the first opening of the second light emitting cell. Accordingly, the light emitting cells may be connected to each other in series.

Furthermore, the first openings of the lower insulation layer may expose the first conductivity type semiconductor layer on at least one side of each light emitting cell along an edge of each of the first and second light emitting cells, the first pad metal layer may contact the first conductivity type semiconductor layer along the edge of the first light emitting cell, and the connection metal layer may contact the first conductivity type semiconductor layer along the edge of the second light emitting cell. A region where the first pad metal layer and the connection metal layer contact the first conductivity type semiconductor layer may be continuous or intermittent.

Moreover, the connection metal layer may contact the first conductivity type semiconductor layer on at least one side along the edge of the second light emitting cell. In particular, the connection metal layer may contact the first conductivity type semiconductor layer on all four sides along the edge of the second light emitting cell. Accordingly, current spreading capability is improved in the second light emitting cell.

The second opening of the lower insulation layer on the second light emitting cell may be one, but the present disclosure is not limited thereto, the second light emitting cell may be plural.

In some embodiments, the first and second pad metal layers exposed through the first and second openings of the upper insulation layer may be bonding pads to which the solder is directly bonded. Therefore, the solder contacts upper surfaces of first and second pad electrode layers exposed through the openings of the upper insulation layer.

In other embodiments, the light emitting diode further comprises first and second bump pads that cover the first and second pad metal layers exposed through the first and second openings of the upper insulation layer, respectively.

The first and second bump pads may cover and seal the first and second openings of the upper insulation layer, respectively.

Furthermore, the second bump pad may also cover an upper insulation layer on an upper portion of the second opening of the lower insulation layer.

In accordance with another exemplary embodiment of the inventive concepts, a light emitting diode comprises: a first conductivity type semiconductor layer; a mesa disposed on the first conductivity type semiconductor layer, and including an active layer and a second conductivity type semiconductor layer; an ohmic reflection layer disposed on the mesa and electrically connected to the second conductivity type semiconductor layer; a lower insulation layer covering the mesa and the ohmic reflection layer, and including a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer, and electrically connected to the ohmic reflection layer through the second opening; and an upper insulation layer covering the first pad metal layer and the second pad metal layer, and including a first opening exposing the first pad metal layer and a plurality of second openings exposing the second pad metal layer, wherein the second openings of the upper insulation layer are separated from the second opening of the lower insulation layer not to overlap each other.

By forming the plurality of second openings in the upper insulation layer, a diffusion path of the solder may be reduced, and furthermore, the plurality of second openings in the upper insulation layer is separated from the second opening in the lower insulation layer so that it is possible to prevent solder from diffusing to the reflection layer.

Meanwhile, the light emitting diode may further include: a first bump pad connected to the first pad metal layer through the first opening of the upper insulation layer; and a second bump pad connected to the second pad metal layer through the plurality of second openings of the upper insulation layer. In addition, the first conductivity type semiconductor layer may be disposed on a substrate.

In some embodiments, a shortest distance from the second opening of the lower insulation layer to the second opening of the upper insulation layer may be greater than a shortest distance between the second openings of the upper insulation layer.

In some embodiments, the lower insulation layer may comprise a plurality of second openings, and a shortest distance from the second opening of the lower insulation layer to the second opening of the upper insulation layer may be greater than a shortest distance between the second openings of the lower insulation layer.

The upper insulation layer and the lower insulation layer prevent the solder from diffusing, but the solder may reach the second opening of the lower insulation layer along an interface between the lower insulation layer and the second pad metal layer. Therefore, by spacing the second opening of the lower insulation layer away from the second opening of the upper insulation layer within a limited design range, the diffusion path of the solder may be increased, thereby preventing defects due to diffusion of the solder.

The first opening of the lower insulation layer may expose the first conductivity type semiconductor layer along a periphery of the mesa, and the first pad metal layer may have an outer contact portion contacting the first conductivity type semiconductor layer along the periphery of the mesa. The first pad metal layer contacts the first conductivity type semiconductor layer along the periphery of the mesa, so that current spreading capability of the light emitting diode may be improved.

In addition, the mesa may comprise an indent portion to expose the first conductivity type semiconductor layer, and the first opening of the lower insulation layer may further expose the first conductivity type semiconductor layer in the indent portion. Furthermore, the first pad metal layer may further comprise an inner contact portion contacting the first conductivity type semiconductor layer in the indent portion.

Since the first pad metal layer contacts the first conductivity type semiconductor layer at the periphery of the mesa and inside the mesa, current spreading capability of the light emitting diode is further enhanced.

Furthermore, the inner contact portion may be connected to the outer contact portion, but the present disclosure is not limited thereto, the inner contact portion and the outer contact portion may be separated from each other.

In some embodiments, the mesa may have a via hole exposing the first conductivity type semiconductor layer through the second conductivity type semiconductor layer and the active layer, wherein the first opening of the lower insulation layer may expose the first conductivity type semiconductor layer exposed in the via hole, and the first pad metal layer may have an inner contact portion contacting the first conductivity type semiconductor layer exposed in the via hole.

Moreover, the first pad metal layer may comprise outer contact portions contacting the first conductivity type semiconductor layer outside the mesa, wherein the outer contact portions may be spaced apart from one another.

Meanwhile, the lower insulation layer may comprise the plurality of second openings, and the second bump pad may cover an upper portion of at least one second opening of the lower insulation layer. Furthermore, the second bump pad may cover entire upper portions of the second openings of the lower insulation layer.

Furthermore, the first and second bump pads may cover and seal the first and second openings of the upper insulation layer, respectively. The first and second bump pads prevent the first and second pad metal layers from being exposed to the solder. In addition, by forming the plurality of the first and second openings of the upper insulation layer, it is possible to reduce the diffusion path of the solder diffused into the first and second pad metal layers through the first and second bump pads, thereby delaying the diffusion of the solder.

Meanwhile, the first bump pad may cover the upper portion of at least one second opening of the lower insulation layer. Any location and shape of the first bump pad capable of being insulated from the second pad metal layer may be variously changed, and any location and shape of the second bump pad capable of being insulated from the first pad metal layer may also be variously changed. For example, the second bump pad may comprise a protrusion between the first bump pad and the second bump pad. Further, at least one of the second openings of the lower insulation layer may be disposed under the protrusion.

Meanwhile, the second pad metal layer may be surrounded by the first pad metal layer. Accordingly, a boundary region in which the lower insulation layer is exposed may be formed between the first pad metal layer and the second pad metal layer. This boundary region may be covered by the upper insulation layer.

In some embodiments, the lower insulation layer may comprise a plurality of second openings, and at least one of the second openings of the upper insulation layer may be disposed between the two second openings of the lower insulation layer.

Meanwhile, a plurality of mesas may be disposed on the first conductivity type semiconductor layer, the second opening of the lower insulation layer and second openings of the upper insulation layer may be disposed on each mesa, and each of the bump pad and the second bump pad may be disposed over the plurality of mesas. Further, the first pad metal layer may cover the mesas, and the second pad metal layer may be disposed on each mesa.

In some embodiments, the second bump pad may be disposed within an upper region of the second pad metal layer, but the inventive concepts are not limited thereto, the second bump pad may partially overlap with the first pad metal layer.

In accordance with embodiments of the inventive concepts, the opening of the upper insulation layer is spaced apart from the opening of the lower insulation layer to prevent the solder, particularly Sn, from diffusing into the ohmic reflection layer through the opening of the lower insulation layer, thereby improving a reliability of the light emitting diode. The diffusion of the solder may be effectively blocked within the limited design range by setting the shortest distance from the opening of the upper insulation layer to the opening of the lower insulation layer to be greater than the shortest distance from the opening of the lower insulation layer to the pad metal layer.

Other advantages and effects of the inventive concepts will become more apparent from the detailed description.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
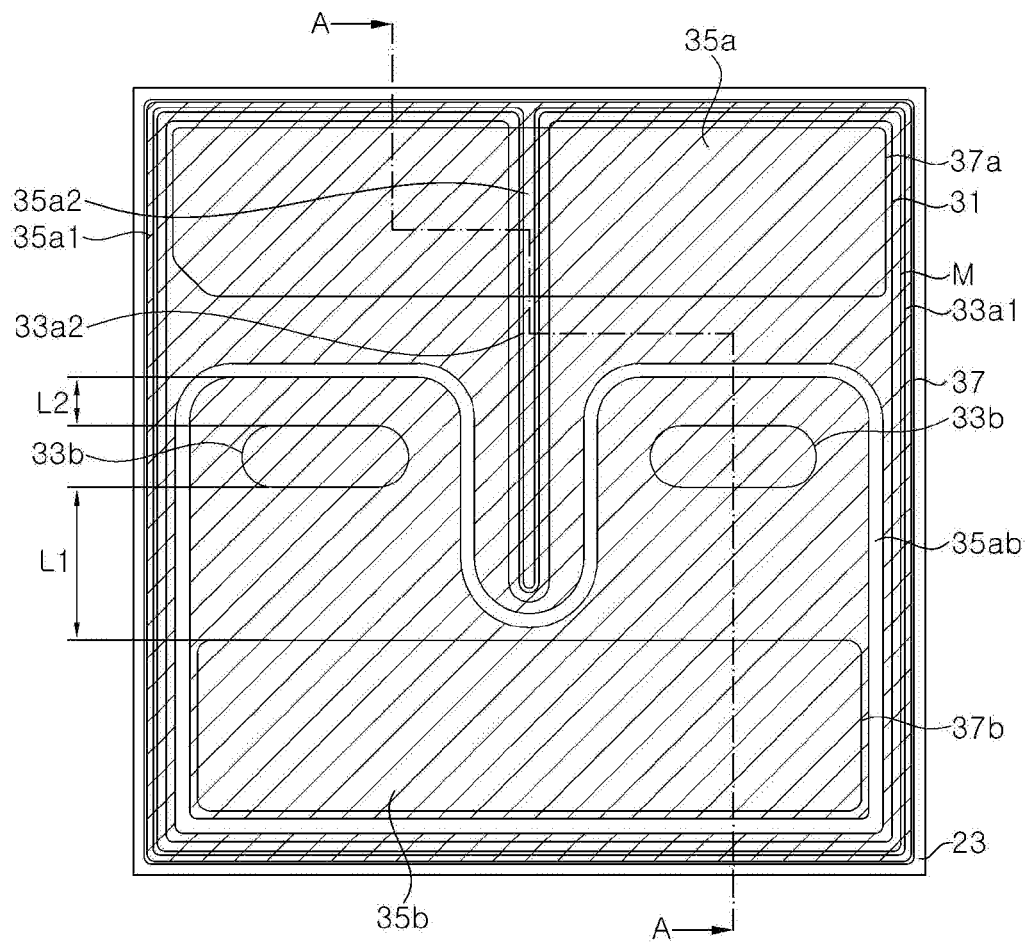
FIG. 1 is a schematic plan view illustrating a light emitting diode according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the scope of the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules, such as control boards and control units. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings. The following embodiments are provided by way of example so as to fully convey the spirit of the inventive concepts to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Figure 2:
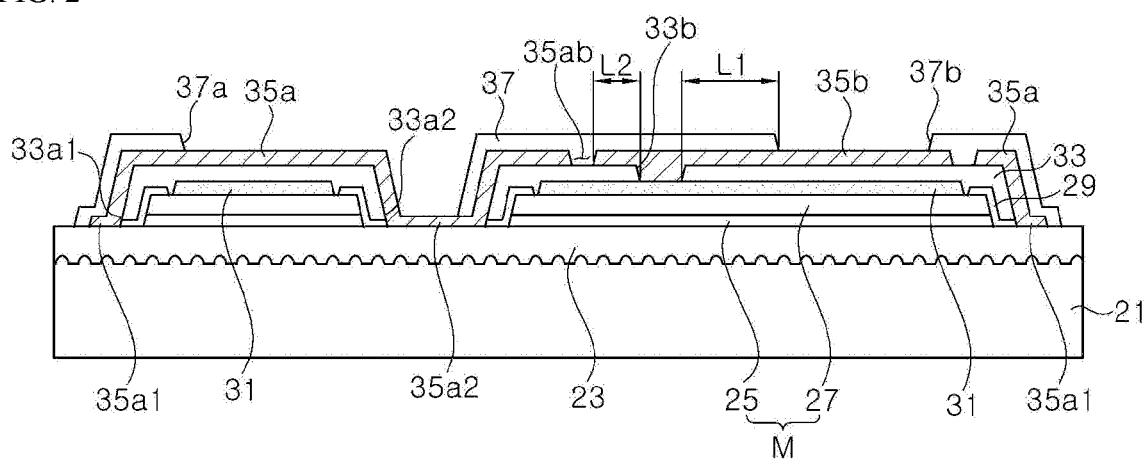
FIG. 2 is a cross-sectional view taken along the line A-A in FIG. 1.

FIG. 1 is a schematic plan view illustrating a light emitting diode according to an exemplary embodiment of the inventive concepts, and FIG. 2 is a cross-sectional view taken along the line A-A in FIG. 1.

Referring FIGS. 1 and 2, the light emitting diode comprises a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, and an upper insulation layer 37. Further, the light emitting diode may further comprise a preliminary insulation layer 29.

The substrate 21 may be selected from any substrates suitable for growth of gallium nitride semiconductor layers thereon. The substrate 21 may include, for example, a sapphire substrate, a gallium nitride substrate, a SiC substrate, and the like, and may be a patterned sapphire substrate. The substrate 21 may have a rectangular or square shape, as shown in the plan view of FIG. 1, without being limited thereto. The size of the substrate 21 is not particularly limited and may be selected in various ways.

The first conductivity type semiconductor layer 23 is disposed on the substrate 21. The first conductivity type semiconductor layer 23 may be a gallium nitride semiconductor layer grown on the substrate 21 and doped with dopants, for example Si.

A mesa M is disposed on the first conductivity type semiconductor layer. The mesa M may be disposed within a region surrounded by the first conductivity type semiconductor layer 23 so that regions near edges of the first conductivity type semiconductor layer are not covered by the mesa M, but exposed to the outside.

The mesa M comprises the second conductivity type semiconductor layer 27 and the active layer 25. The active layer 25 is interposed between the first conductivity type semiconductor layer 23 and the second conductivity type semiconductor layer 27. The active layer 25 may have a single quantum well structure or a multiple quantum well structure. A composition and a thickness of the well layer in the active layer 25 determine a wavelength of generated light. In particular, by controlling the composition of the well layer, it is possible to provide an active layer generating ultraviolet light, blue light or green light.

Meanwhile, the second conductivity type semiconductor layer 27 may be a gallium nitride semiconductor layer doped with p-type dopants, for example, Mg. Each of the first conductivity type semiconductor layer 23 and the second conductivity type semiconductor layer 27 may be composed of a single layer or multiple layers and may include superlattice layers. The first conductivity type semiconductor layer 23, the active layer 25 and the second conductivity type semiconductor layer 27 may be grown on the substrate 21 in a chamber by a well-known method, such as metal organic chemical vapor deposition (MOCVD).

As shown in FIG. 1, the mesa M may have an indent portion intruding therein, and an upper surface of the first conductivity type semiconductor layer 23 may be exposed by the indent portion. The indent portion may be formed long from one side edge of the mesa M toward the other side opposite to the mesa M, and may pass through a center of the mesa M. In the present embodiment, it is described that the mesa M has the indent portion, but the mesa M may have a rectangular shape similar to the substrate 21, and may be formed to have a through hole(s) exposing the first conductivity type semiconductor layer 23, for example.

Meanwhile, the ohmic reflection layer 31 is disposed over the mesa M and is electrically connected to the second conductivity type semiconductor layer 27. The ohmic reflection layer 31 may be disposed over substantially the entire region of the second conductivity type semiconductor layer 27 in an upper region of the mesa M. For example, the ohmic reflection layer 31 may cover 80% or more, further, 90% or more of the upper region of the mesa M.

The ohmic reflection layer 31 may include a reflective metallic layer and thus can reflect light generated from the active layer 25 and travelling to the ohmic reflection layer 31, toward the substrate 21. For example, the ohmic reflection layer 31 may be composed of a single reflective metallic layer, but is not limited thereto. Alternatively, the ohmic reflection layer 31 may include an ohmic layer and a reflection layer. The ohmic layer may be a metal layer such as a Ni layer or a transparent oxide layer such as an ITO layer, and the reflection layer may be a metal layer having high reflectance such as an Ag or Al layer.

Meanwhile, a preliminary insulation layer 29 may cover the mesa M in a periphery of the ohmic reflection layer 31. The preliminary insulation layer 29 may be formed of $SiO_2$, and may cover a side of the mesa M and may further cover a partial region of the first conductivity type semiconductor layer 23. In another embodiment, the preliminary insulation layer 29 may be disposed only on the periphery of the ohmic reflection layer 31 in the upper region of the mesa M.

The lower insulation layer 33 covers the mesa M and the ohmic reflection layer 31. The lower insulation layer 33 may also cover the first conductivity type semiconductor layer 23 along a periphery of the mesa M, and may cover the first conductivity type semiconductor layer 23 in the indent portion inside the mesa M. The lower insulation layer 33 covers side surfaces of the mesa M in particular.

Meanwhile, the lower insulation layer 33 has first and second openings 33a1 and 33a2 exposing the first conductivity type semiconductor layer 23 and a second opening 33b exposing the ohmic reflection layer 31. The first opening 33a1 exposes the first conductivity type semiconductor layer 23 along the periphery of the mesa M, and the first opening 33a2 exposes the first conductivity type semiconductor layer 23 in the indent portion. As shown in FIG. 1, the first opening 33a1 and the first opening 33a2 may be connected to each other. However, the inventive concepts are not limited thereto, but the first opening 33a1 and the first opening 33a2 may be separated from each other.

The second opening 33b exposes the ohmic reflection layer 31. A plurality of second openings 33b may be formed, and these second openings 33b may be disposed on both sides of the indent portion. Locations of the second openings 33b will be described later.

Meanwhile, the lower insulation layer 33 covers the preliminary insulation layer 29 and is integrated with the preliminary insulation layer 29. Unless specifically stated, it should be understood that the preliminary insulation layer 29 is included in the lower insulation layer 33. The lower insulation layer 33 may be formed of a single layer of $SiO_2$ or $Si_3N_4$, without being limited thereto. For example, the lower insulation layer 33 may have a multilayer structure which includes a silicon oxide layer and a silicon nitride layer, and may include a distributed Bragg reflector in which silicon oxide layers and titanium oxide layers are alternately stacked one above another.

The first pad metal layer 35a is disposed on the lower insulation layer 33 and is insulated from the mesa M and the ohmic reflection layer 31 by the lower insulation layer 33. The first pad metal layer 35a contacts the first conductivity type semiconductor layer 23 through the first openings 33a1 and 33a2 of the lower insulation layer 33. The first pad metal layer 35a may include an outer contact portion 35a1 contacting the first conductivity type semiconductor layer 23 along the periphery of the mesa M and an inner contact portion 35a2 contacting the first conductivity type semiconductor layer 23 in the indent portion. The outer contact portion 35a1 contacts the first conductivity type semiconductor layer 23 near an edge of the substrate 21 along the periphery of the mesa M, and the inner contact portion 35a2 contacts the first conductivity type semiconductor layer 23 in a region surrounded by the outer contact portion 35a1. The outer contact portion 35a1 and the inner contact portion 35a2 may be connected to each other, but the inventive concepts are not limited thereto, and they may be separated from each other.

Meanwhile, the second pad metal layer 35b is disposed on the upper region of the mesa M on the lower insulation layer 33, and is electrically connected to the ohmic reflection layer 31 through the second opening 33b of the lower insulation layer 33. The second pad metal layer 35b may be surrounded by the first pad metal layer 35a, and a boundary region 35ab may be formed therebetween. The lower insulation layer 33 is exposed to the boundary region 35ab, and this boundary region 35ab is covered with the upper insulation layer 37, which will be described later.

The first pad metal layer 35a and the second pad metal layer 35b may be formed of the same material by the same process. The first and second pad metal layers 35a and 35b may include a highly ohmic reflective layer such as an Al layer, and the highly ohmic reflective layer may be formed on an adhesive layer such as Ti, Cr, or Ni. Furthermore, a protective layer of a single layer or a multiple layer structure such as Ni, Cr, Au, or the like may be formed on the highly ohmic reflective layer. The first and second pad metal layers 35a and 35b may have multilayer structures of Cr/Al/Ni/Ti/Ni/Ti/Au/Ti, for example.

The upper insulation layer 37 covers the first and second pad metal layers 35a and 35b. In addition, the upper insulation layer 37 may cover the first conductivity type semiconductor layer 23 along the periphery of the mesa M. However, the upper insulation layer 37 may expose the first conductivity type semiconductor layer 23 along the edge of the substrate 21.

Meanwhile, the upper insulation layer 37 has a first opening 37a exposing the first pad metal layer 35a and a second opening 37b exposing the second pad metal layer 35b. The first opening 37a and the second opening 37b may be disposed in the upper region of the mesa M and may be arranged to face each other. In particular, the first opening 37a and the second opening 37b may be disposed close to both side edges of the mesa M.

The second opening 33b of the lower insulation layer 33 described above may be interposed between the first opening 37a and the second opening 37b of the upper insulation layer 37. The second opening 33b of the lower insulation layer 33 is separated from both the second opening 37b and the first opening 37a of the upper insulation layer 37.

As shown in FIGS. 1 and 2, a shortest distance L1 from the second opening 37b of the upper insulation layer 37 to the second opening 33b of the lower insulation layer 33 is greater than a shortest distance L2 from the second opening 33b of the lower insulation layer 33 to an edge of the second pad metal layer 35b. Accordingly, the second opening 33b of the lower insulation layer 33 may be relatively farther away from the second opening 37b of the upper insulation layer 37, and thus contamination of the ohmic reflection layer 31 by solder may be prevented more effectively.

The upper insulation layer 37 may be formed of a single layer of $SiO_2$ or $Si_3N_4$, without being limited thereto. For example, the upper insulation layer 37 may have a multi-layer structure which includes a silicon oxide layer and a silicon nitride layer, and may include a distributed Bragg reflector in which silicon oxide layers and titanium oxide layers are alternately stacked one above another.

The first and second pad metal layers 35a and 35b exposed to the first and second openings 37a and 37b of the upper insulation layer 37 may serve as bonding pads to which the solder is directly bonded. Accordingly, when the light emitting diode according to the present embodiment is bonded to a printed circuit board or a submount using solder, the solder may directly contact the first and second pad metal layers 35a and 35b. In another embodiment, first and second bump pads may be added on the first and second pad metal layers 35a and 35b, which will be described with reference to FIGS. 3 and 4.

Figure 3:
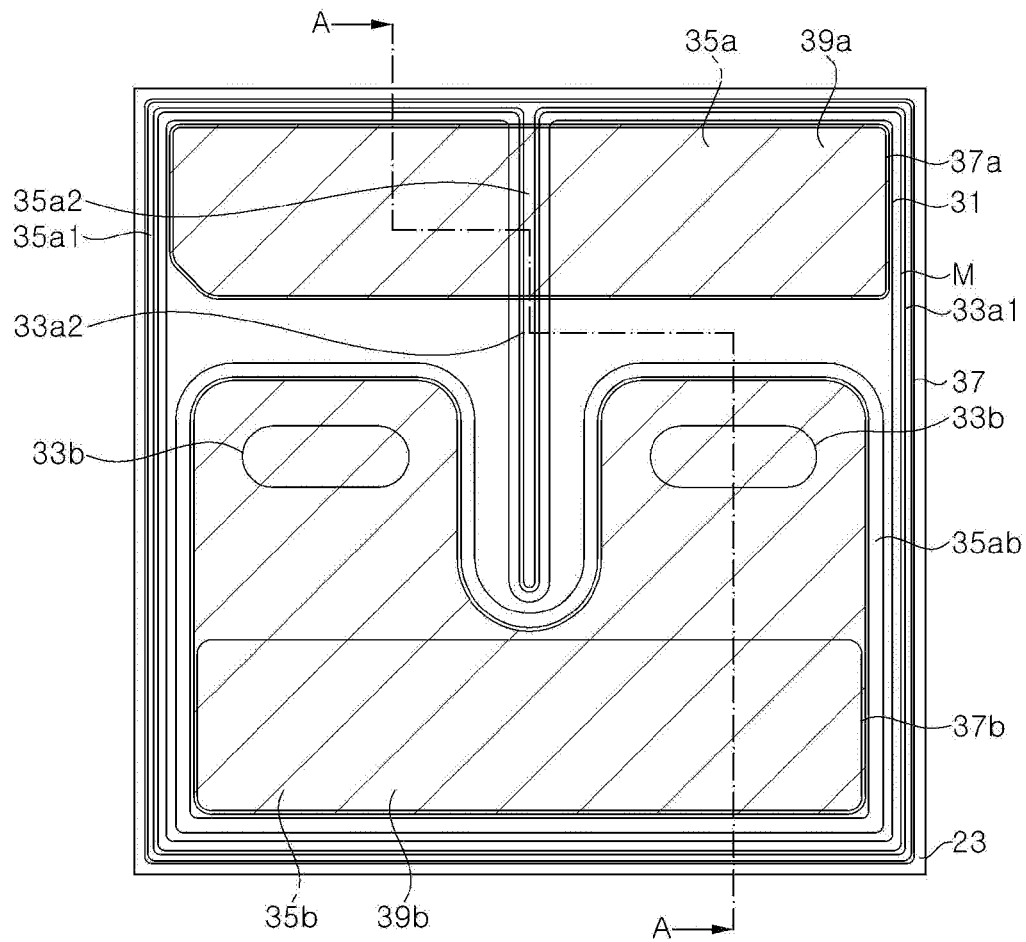
FIG. 3 is a schematic plan view illustrating a light emitting diode according to another embodiment of the inventive concepts.
Figure 4:
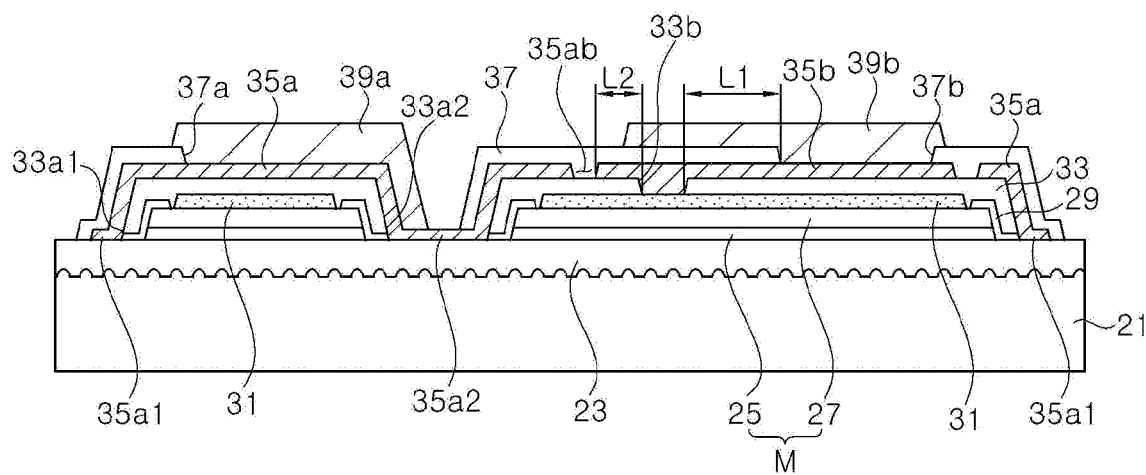
FIG. 4 is a cross-sectional view taken along the line A-A of FIG. 3.

FIG. 3 is a schematic plan view illustrating a light emitting diode according to another embodiment of the inventive concepts, and FIG. 4 is a cross-sectional view taken along the line A-A of FIG. 3.

Referring to FIGS. 3 and 4, the light emitting diode according to the present embodiment is substantially similar to the light emitting diode described with reference to FIGS. 1 and 2 except that the light emitting diode further comprises first and second bump pads 39a and 39b.

The first bump pad 39a covers the first pad metal layer 35a exposed through the first opening 37a of the upper insulation layer 37, and the second bump pad 39b covers the second pad metal layer 35b exposed through the second opening 37b of the upper insulation layer 37. Each of the first and second bump pads 39a and 39b may cover the first and second openings 37a and 37b of the upper insulation layer 37. Therefore, the first and second bump pads 39a and 39b may be larger than the first and second openings 37a and 37b.

Further, the second bump pad 39b may cover the upper insulation layer 37 on an upper portion of the second opening 33b of the lower insulation layer 33. As shown in FIG. 3, the second bump pad 39b may have a shape substantially similar to that of the second pad metal layer 35b, and may also have a similar size.

By forming the first and second bump pads 39a and 39b, a diffusion path of the solder is increased, thereby further improving a reliability of the light emitting diode. In particular, in a case that a defect such as a pinhole occurs in an upper insulation layer 37, the second bump pads 39a and 39b prevent the solder from diffusing into the pinhole, thereby improving the reliability of the light emitting diode.

Figure 5:
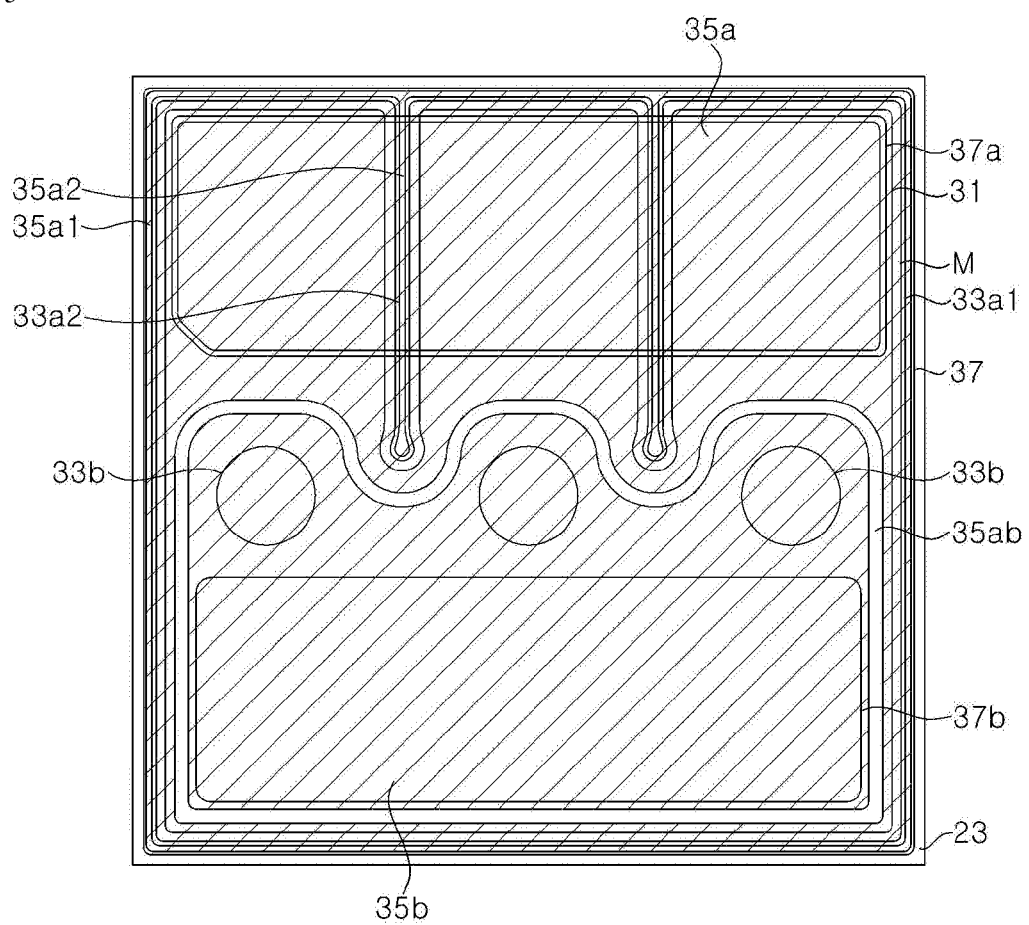
FIG. 5 is a schematic plan view illustrating a light emitting diode according to another embodiment of the inventive concepts.

FIG. 5 is a schematic plan view illustrating a light emitting diode according to another embodiment of the inventive concepts.

Referring to FIG. 5, the light emitting diode according to the present embodiment is substantially similar to the light emitting diode described with reference to FIGS. 1 and 2 except that indent portions formed inside the mesa M are added and shapes of the second openings 33b of the lower insulation layer 33 is different.

Although two indent portions are shown in the present embodiment, the number of indent portions may be larger. The lower insulation layer 33 has the first opening 33a2 in the indent portion, and the first pad metal layer 35a is connected to the first conductivity type semiconductor layer 23 through the first opening 33a2. Accordingly, as the number of indent portions increases, the number of inner contact portions 35a2 of the first pad metal layer 35a increases, thereby improving current spreading capability.

Meanwhile, a shape of an end terminal portion of the indent portion, which has a round shape as a width becomes wider at the end terminal portion thereof, differs from a shape of the indent portion of FIG. 1. As the shape of the end terminal portion of the indent is formed as described above, the lower insulation layer 33 may be formed in a similar shape. In particular, in a case that the lower insulation layer 33 includes a distributed Bragg reflector, if a width of the distributed Bragg reflector is not widened at the end terminal portion as shown in FIG. 1, a severe double step is formed in a side wall of the distributed Bragg reflector, and the pad metal layer 35a is likely to be cracked as an inclination angle of the side wall becomes large. Accordingly, the lower insulation layer 33 may be formed to have a gentle inclination angle by forming the shape of the end terminal portion of the indent portion and the shape of the end terminal portion of the first opening 33a2 of the lower insulation layer 33 as in the present embodiment, thereby improving yield of the light emitting diode.

In the above embodiments, the second openings 33b of the lower insulation layer 33 have a shape elongated in a direction perpendicular to the indent portion. However, in the present embodiment, the second openings 33a have a circular shape, that is, a convex shape outward. A pattern having the elongated shape in one direction is not easily etched at the end terminal portion thereof, but the second openings 33b having the circular shape as in the present embodiment may be formed easily.

Also in the present embodiment, a shortest distance between the second openings 33b and the second opening 37a of the upper insulation layer 37 may be greater than a shortest distance between the second openings 33b and an edge of the second pad metal layer 35b.

Figure 6:
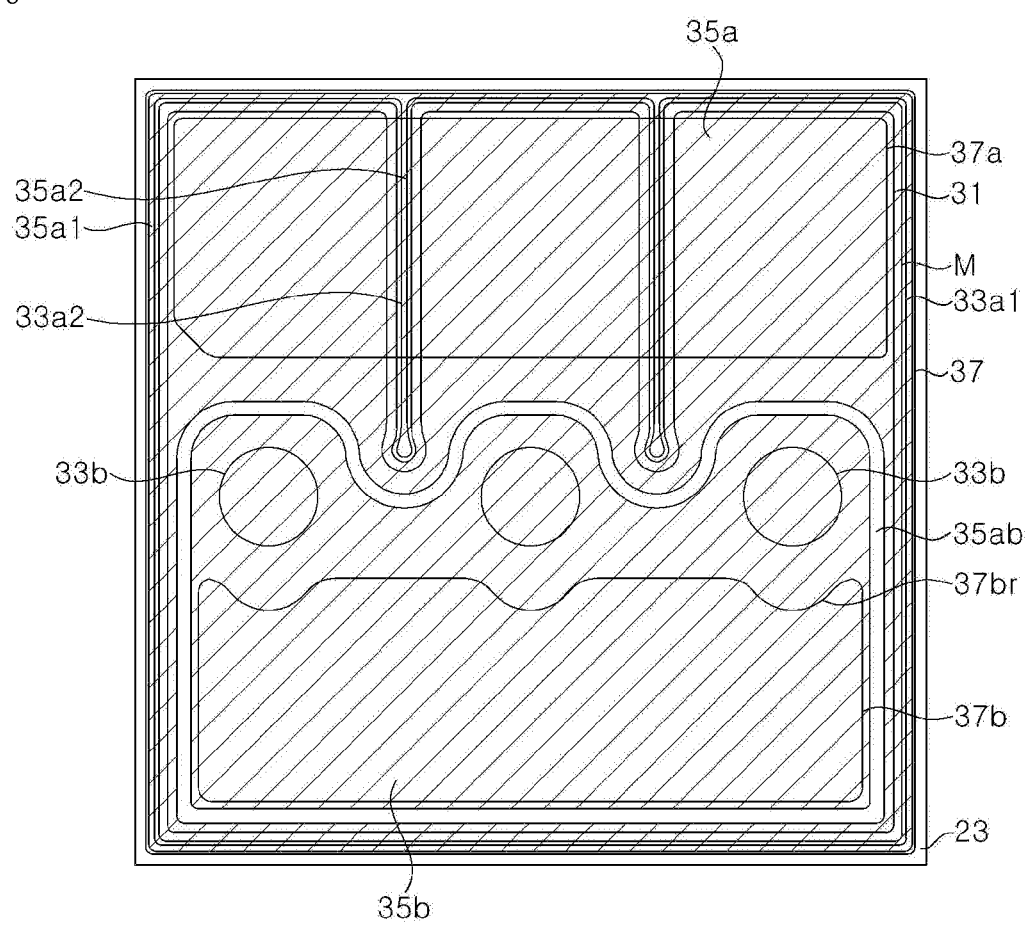
FIG. 6 is a schematic plan view illustrating a light emitting diode according to another embodiment of the inventive concepts.

FIG. 6 is a schematic plan view illustrating a light emitting diode according to another embodiment of the inventive concepts.

Referring to FIG. 6, the light emitting diode according to the present embodiment is substantially similar to the light emitting diode described with reference to FIG. 5 except that a shape of the second opening 37b of the upper insulation layer 37 is different. That is, in the present embodiment, the second opening 37b of the upper insulation layer 37 has a concave shape 37br corresponding to the shape of the second openings 33b of the lower insulation layer 33.

The second openings 33b of the lower insulation layer 33 may have the circular shape as described above, and thus have a convex shape toward the second opening 37b of the upper insulation layer. The second opening 37b of the upper insulation layer 37 has the concave shape 37br corresponding to the convex shape of the second openings 33b of the lower insulation layer 33.

Accordingly, a shortest distance between the second openings 33b of the lower insulation layer 33 and the second openings 37b of the upper insulation layer 37 may be relatively increased, thereby further increasing the diffusion path of the solder.

Figure 7:
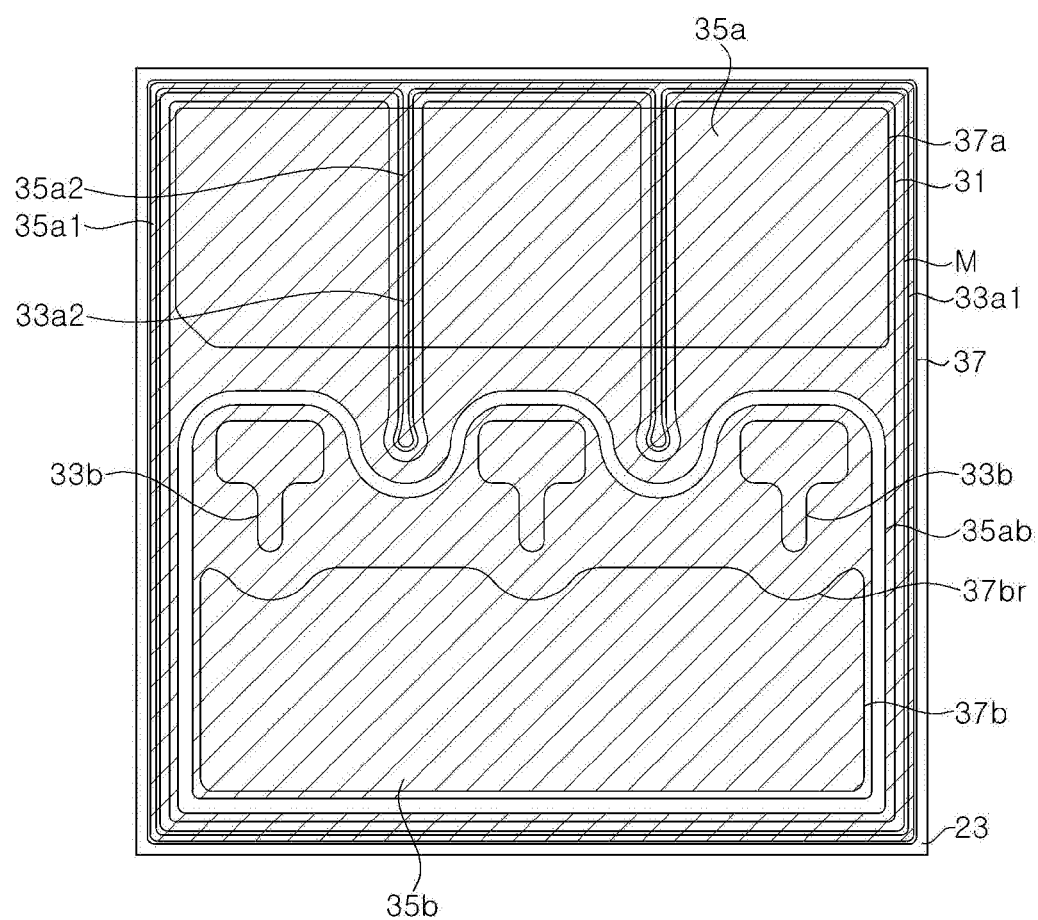
FIG. 7 is a schematic plan view illustrating a light emitting diode according to another embodiment of the inventive concepts.

FIG. 7 is a schematic plan view illustrating a light emitting diode according to another embodiment of the inventive concepts.

Referring to FIG. 7, the light emitting diode according to the present embodiment is substantially similar to the light emitting diode described with reference to FIG. 6 except that a shape of the second openings 33b of the lower insulation layer 33 is different. The second openings 33b may have various shapes and may have various convex shapes toward the second openings 37b of the upper insulation layer 37, in particular.

Meanwhile, in the embodiments described with reference to FIGS. 5 to 7, although the first and second bump pads 39a and 39b are not separately described, the first and second bump pads 39a and 39b may also be added in these embodiments as described above with reference to FIGS. 3 and 4. The second bump pad 39b may also cover the second openings 33b of the lower insulation layer 33.

Figure 8:
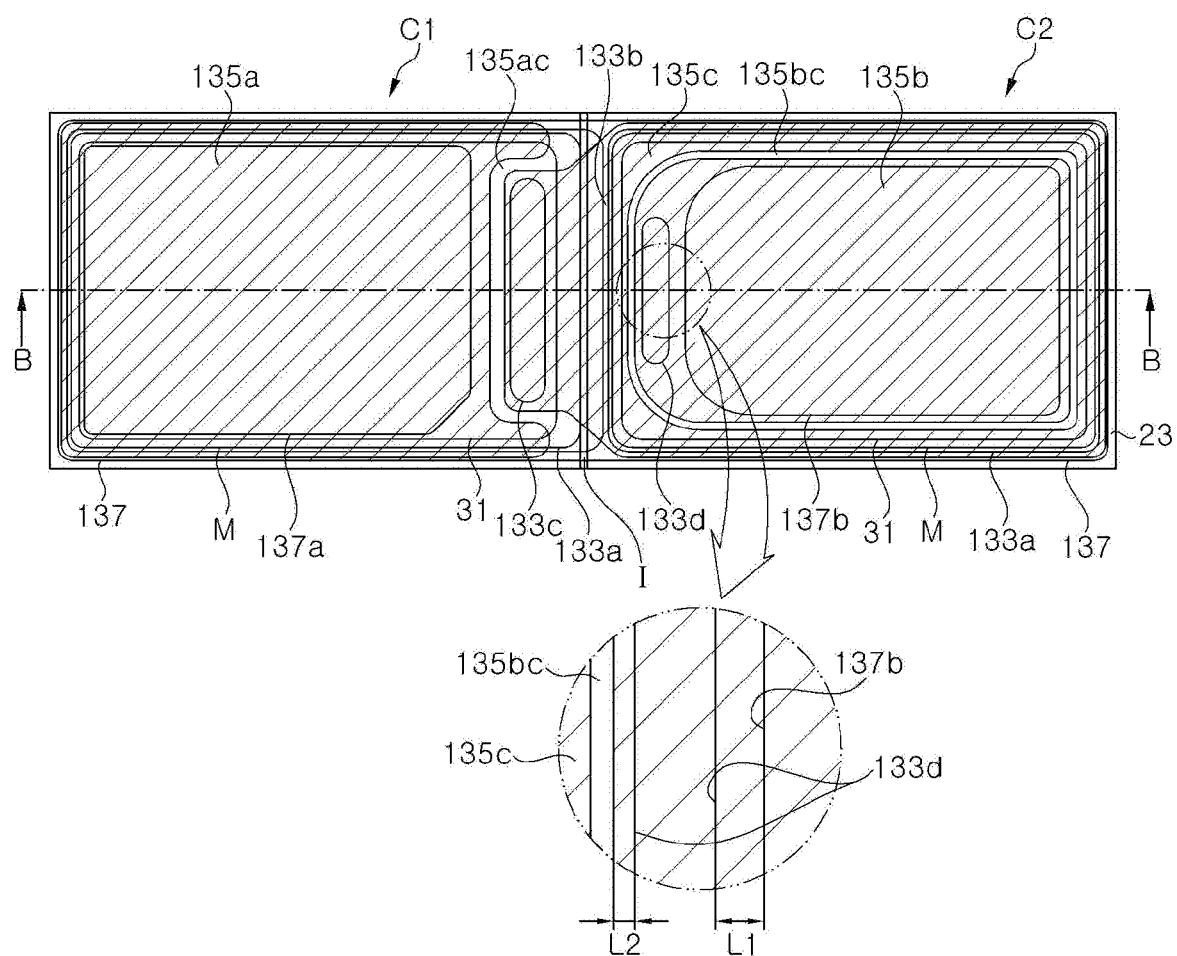
FIG. 8 is a schematic plan view illustrating a light emitting diode according to another embodiment of the inventive concepts.
Figure 9:
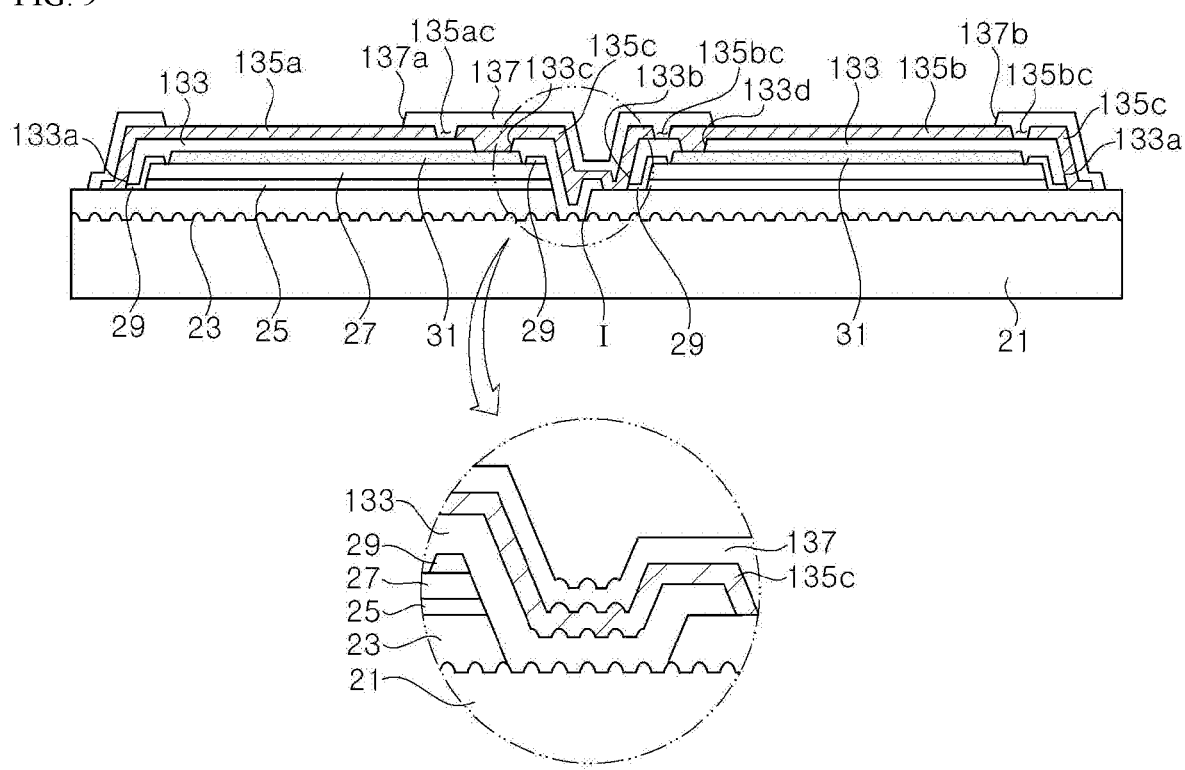
FIG. 9 is a cross-sectional view taken along the line B-B of FIG. 8.

FIG. 8 is a schematic plan view illustrating a light emitting diode according to another embodiment of the inventive concepts, and FIG. 9 is a cross-sectional view taken along the line B-B of FIG. 8.

Referring to FIGS. 8 and 9, the light emitting diode comprises a substrate 21, a first light emitting cell C1, a second light emitting cell C2, an ohmic reflection layer 31, a lower insulation layer 133, first and second pad metal layers 135a and 135b, a connection metal layer 135c, and an upper insulation layer 137. The light emitting diode may also comprise a preliminary insulation layer 29, and the preliminary insulation layer 29 is integrated into the lower insulation layer 133. In addition, each of the first and second light emitting cells C1 and C2 comprises a first conductivity type semiconductor layer 23 and a mesa M disposed on the first conductivity type semiconductor layer 23, and each mesa M comprises an active layer 25 and a second conductivity type semiconductor layer 27.

The substrate 21 may be a growth substrate for growing a Gallium nitride based semiconductor layer, for example, a sapphire substrate, a Gallium nitride substrate, a SiC substrate, or the like, and particularly a patterned sapphire substrate. The substrate 21 is preferably an insulating substrate, but is not limited to the insulating substrate. However, in a case that light emitting cells C1 and C2 disposed on the substrate 21 are connected to each other in series, the substrate 21 must be insulated from the light emitting cells. Therefore, the substrate 21 may be insulative, or if the substrate 21 is conductive, an insulation material layer is formed between the light emitting cells C1 and C2 and the substrate 21 for the light emitting cells C1 and C2 to be insulated from the substrate 21. The substrate 21 may have a rectangular outer shape as shown in FIG. 8.

The first and second light emitting cells C1 and C2 are disposed on the substrate 21. The first and second light emitting cells C1 and C2 are separated from each other by an isolation region I exposing the substrate 21. Therefore, semiconductor layers of the first light emitting cell C1 and the second light emitting cell C2 are spaced apart from each other. Each of the first and second light emitting cells C1 and C2 are disposed facing each other and may have a square or rectangular shape, respectively. In particular, the first and second light emitting cells C1 and C2 may have elongated rectangular shapes in a direction facing each other.

Each of the first and second light emitting cells C1 and C2 comprises a first conductivity type semiconductor layer 23, an active layer 25 and a second conductivity type semiconductor layer 27. The first conductivity type semiconductor layer 23, the active layer 25 and the second conductivity type semiconductor layer 27 may be formed of III-V nitride semiconductors, for example, nitride semiconductors such as (Al, Ga, In)N. The first conductivity type semiconductor layer 23, the active layer 25, and the second conductivity type semiconductor layer 27 may be grown and formed on the substrate 21 in a chamber using a well known method such as Metal Organic Chemical Vapor Deposition (MOCVD). In addition, the first conductivity type semiconductor layer 23 comprises n-type impurities (for example Si, Ge, and Sn), the second conductivity type semiconductor layer 27 comprises p-type impurities (for example, Mg, Sr, and Ba), and vice versa. In one embodiment, the first conductivity type semiconductor layer 23 may comprise GaN or AlGaN containing Si as a dopant, and the second conductivity type semiconductor layer 27 may comprise GaN or AlGaN containing Mg as a dopant. Although each of the first conductivity type semiconductor layer 23 and the second conductivity type semiconductor layer 27 is shown as a single layer in the drawings, these layers may be multi-layered and may also comprise a superlattice layer. The active layer 25 may comprise a single quantum well structure or a multiple quantum well structure, and a composition ratio of the nitride-based semiconductor is adjusted so as to emit a desired wavelength. For example, the active layer 25 may emit blue light or ultraviolet light.

An isolation region I separates the light emitting cells C1 and C2 from each other. Accordingly, the substrate 21 is exposed to the isolation region I through semiconductor layers. The isolation region I is formed using photolithography and etching processes, the photoresist pattern having a gentle inclined surface is formed and the semiconductor layers are etched using the photoresist pattern as a mask, thereby forming relatively gently inclined side surfaces in the isolation region I.

The light emitting cells C1 and C2 face each other with the isolation region I interposed therebetween. Side surfaces of the light emitting cells C1 and C2 facing each other are defined as inner side surfaces, and side surfaces of the light emitting cells other than the inner side surfaces are defined as outer side surfaces. Therefore, the first conductivity type semiconductor layers 23 in the first and second light emitting cells C1 and C2 also comprise inner and outer side surfaces, respectively. For example, the first conductivity type semiconductor layer 23 may comprise one inner side surface and three outer side surfaces.

A mesa M is disposed on each of first conductivity type semiconductor layers 23. The mesa M may be located within a region surrounded by the side surfaces of the first conductivity type semiconductor layer 23, and thus regions near edges adjacent to the outer side surfaces of the first conductivity type semiconductor layer 23 are not covered by the mesa M, but are exposed to the outside. However, a side surface of the mesa M and a side surface of the first conductivity type semiconductor layer 23 on a sidewall of the isolation region I may be continuous with each other.

The mesa M comprises a second conductivity type semiconductor layer 27 and an active layer 25. The active layer 25 is interposed between the first conductivity type semiconductor layer 23 and the second conductivity type semiconductor layer 27.

Ohmic reflection layers 31 are disposed on the second conductivity type semiconductor layers 27 of the first and second light emitting cells C1 and C2, respectively. The ohmic reflection layers 31 contact the second conductivity type semiconductor layers 27. The ohmic reflection layer 31 may be disposed substantially over an entire area of the mesa M in an upper region of the mesa M. For example, the ohmic reflection layer 31 may cover 80% or more, further, 90% or more of the upper region of the mesa M.

The ohmic reflection layer 31 may comprise a reflective metallic layer and thus may reflect light generated in the active layer 25 and traveling to the ohmic reflection layer 31, toward the substrate 21. For example, the ohmic reflection layer may include Ag or Al. In addition, the ohmic reflection layer 31 may include an Ni layer to form ohmic contact with the second conductivity type semiconductor layer 27.

Meanwhile, a preliminary insulation layer 29 may cover the mesa M in a periphery of the ohmic reflection layer 31. The preliminary insulation layer 29 may be formed of $SiO_2$ using a chemical vapor deposition technique, for example, and may cover a side of the mesa M and may further cover a partial region of the first conductivity type semiconductor layer 23. The preliminary insulation layer 29 may be removed at sides of the isolation region I as shown in FIG. 8.

The lower insulation layer 133 covers the ohmic reflection layer 31 and the preliminary insulation layer 29 while covering the mesas Ms. The lower insulation layer 133, in addition, covers the isolation region I and sidewalls of the mesa M and covers a portion of the first conductivity type semiconductor layer 23 in a periphery of the mesa M. As shown in the enlarged cross-sectional view of FIG. 8, the lower insulation layer 133 may be formed along a shape of protrusions on the substrate 21 in the isolation region I in a case that the substrate 21 is a patterned sapphire substrate.

The lower insulation layer 133 is disposed between first and second pad metal layers 135a and 135b and the first and second light emitting cells C1 and C2, and has openings 133a, 133b, 133c, and 133d to provide a passage for the first and second pad metal layers 135a and 135b to be connected to the first conductivity type semiconductor layer 23 or the ohmic reflection layer 31. For example, the lower insulation layer 133 may include first openings 133a and 133b exposing the first conductivity type semiconductor layer 23 of the first and second light emitting cells C1 and C2, and second openings 133c and 133d exposing the ohmic reflection layer 31 of the first and second light emitting cells C1 and C2. The first opening 133a exposes the first conductivity type semiconductor layer 23 along outer surfaces of the mesa M, and the first opening 133b exposes the first conductivity type semiconductor layer 23 along inner surfaces of the mesa M. The first opening 133a and the second opening 133b may be connected each other as shown in FIG. 8, but the inventive concepts are not limited thereto, they may be separated from each other.

Meanwhile, the second opening 133c exposes the ohmic reflection layer 31 on the first light emitting cell C1, and the second opening 133d exposes the ohmic reflection layer 31 on the second light emitting cell C2. The second opening 133d may be formed to be smaller than the second opening 133c. The second openings 133c and 133d may generally have elongated shapes along the isolation region I, but the inventive concepts are not limited thereto, they may have various shapes.

The lower insulation layer 133 may be formed of an insulating material such as $SiO_2$ or $Si_3N_4$, and may be formed as a single layer or multiple layers. Further, the lower insulation layer 133 may comprise a distributed Bragg reflector formed by repeatedly stacking material layers having different refractive indices, for example, $SiO_2/TiO_2$. When the lower insulation layer 133 comprises the distributed Bragg reflector, light incident on a region other than the ohmic reflection layer 31 may be reflected and light extraction efficiency may be improved.

Meanwhile, the first pad metal layer 135a, the second pad metal layer 135b and the connection metal layer 135c are disposed on the lower insulation layer 133.

The first pad metal layer 135a is disposed on the first light emitting cell C1 and forms ohmic contact with the first conductivity type semiconductor layer 23. The first pad metal layer 135a may form ohmic contact with the first conductivity type semiconductor layer 23 in a region between an outer side surface of the first conductivity type semiconductor layer 23 and the mesa M along the periphery of the mesa M, as well illustrated in the FIG. 8. Although the first pad metal layer 135a is illustrated as continuously contacting the first conductivity type semiconductor layer 23 along the periphery of the mesa M in the drawings, the present disclosure is not limited thereto, it may intermittently contact the first conductivity type semiconductor layer 23. That is, the first pad metal layer 135a may contact the first conductivity type semiconductor layer 23 in a plurality of regions separated from each other around the mesa M. Further, the first pad metal layer 135a may cover the upper region and the outer side surfaces of the mesa M.

The second pad metal layer 135b is disposed on the second light emitting cell C2 and is connected to the ohmic reflection layer 31 on the second light emitting cell C2 through the second opening 133d of the lower insulation layer 133. The second pad metal layer 135b is disposed on the mesa M and is insulated from the first conductivity type semiconductor layer 23. For example, the second pad metal layer 135b may be separated from the sides of the mesa M on the second light emitting cell C2. The second pad metal layer 135b may substantially cover an entire area of the mesa M on the second light emitting cell C2, and may cover 50% or more of the upper area of the mesa M, for example.

Meanwhile, the connection metal layer 135c may be electrically connected to the ohmic reflection layer 31 on the first light emitting cell C1 through the second opening 133c of the first light emitting cell C1, and may be electrically connected to the first conductivity type semiconductor layer 23 of the second light emitting cell C2 through the first openings 133a and 133b of the second light emitting cell C2. Accordingly, the first and second light emitting cells C1 and C2 are connected to each other in series through the connection metal layer 135c.

The connection metal layer 135c may contact the first conductivity type semiconductor layer 23 on at least one side along an edge of the second light emitting cell C1. In particular, the connection metal layer 135c may contact the first conductivity type semiconductor layer 23 continuously or intermittently along the periphery of the mesa M. In addition, the connection metal layer 135c may surround the second pad metal layer 135b, and a boundary region 133bc may be formed between the connection metal layer 135c and the second pad metal layer 135b. Meanwhile, a boundary region 133ac is formed between the connection metal layer 135c and the first pad metal layer 135a. These boundary regions 133ac and 133bc are covered with an upper insulation layer 137, which will be described later.

The first and second pad metal layers 135a and 135b and the connection metal layer 135c may be formed of the same material by the same process. For example, the first and second pad metal layers 135a and 135b and the connection metal layer 135c may include a highly ohmic reflective layer such as an Al layer, and the highly ohmic reflective layer may be formed on an adhesive layer such as Ti, Cr, or Ni.

Furthermore, a protective layer of a single layer or a multiple layer structure such as Ni, Cr, Au, or the like may be formed on the highly ohmic reflective layer. The first and second pad metal layers 135a and 135b and the connection metal layer 135c may have multilayer structures of Cr/Al/Ni/Ti/Ni/Ti/Au/Ti, for example.

The upper insulation layer 137 is disposed on the first pad metal layer 135a, the second pad metal layer 135b and the connection metal layer 135c, and has a first opening 137a exposing the first pad metal layer 135a and a second opening 137b exposing the second pad metal layer 135b. The upper insulation layer 137 also covers the first pad metal layer 135a and the connection metal layer 135c connected to the first conductivity type semiconductor layer 23 in the periphery of the mesa M. As shown in FIG. 8, a region between the first pad metal layer and the second connection metal layer 135c and an edge of the first conductivity type semiconductor layer 23 is covered with the upper insulation layer 137. In addition, the upper insulation layer 37 may cover the connection metal layer 135c on the isolation region I, and may be formed to have irregularities according to a shape of the connection metal layer 135c. The upper insulation layer 137 protects the first and second pad metal layers 135a and 135b and the connection metal layer 135c from external environments such as moisture.

Meanwhile, the first opening 137a is formed within an upper region of the first pad metal layer 135a, and thus is separated from the connection metal layer 135c and the second opening 133c of the lower insulation layer 133. In addition, the second opening 137b is also disposed limitedly on the second pad metal layer 135b, and is separated from the connection metal layer 135c. Further, the second opening 137b is separated from the second opening 133d of the lower insulation layer 133. In particular, a shortest distance L1 from the second opening 133d of the lower insulation layer 133 to the second opening 137b of the upper insulation layer 137 is greater than a shortest distance L2 from the second opening 133d of the lower insulation layer 133 to an edge of the second pad metal layer 135b. The second opening 137b of the upper insulation layer 137 is further separated from the second opening 133d than the edge of the second pad metal layer 135b is separated from the second opening 133d, thereby effectively preventing diffusion of the solder within a limited design range.

The upper insulation layer 137 may be formed of a single layer of $SiO_2$ or $Si_3N_4$, without being limited thereto. For example, the upper insulation layer 137 may have a multiple layer structure comprising a silicon nitride layer and a silicon oxide layer, or may be a distributed Bragg reflector where a silicon oxide layer and a titanium oxide layer are alternately stacked one above another.

In the present embodiment, the first and second pad metal layers 135a and 135b exposed through the first and second openings 137a and 137b of the upper insulation layer 137 may serve as bonding pads to which the solder is directly bonded. Alternatively, as described with reference to FIGS. 3 and 4, the first and second bump pads may cover the first and second pad metal layers 135a and 135b exposed through the first and second openings 137a and 137b of the upper insulation layer 137, respectively. Further, the first and second bump pads may cover and seal the first and second openings 137a and 137b of the upper insulation layer 137, respectively, and the second bump pad may cover an upper region of the second opening 133d of the lower insulation layer 133 on the second light emitting cell C2.

Figure 10:
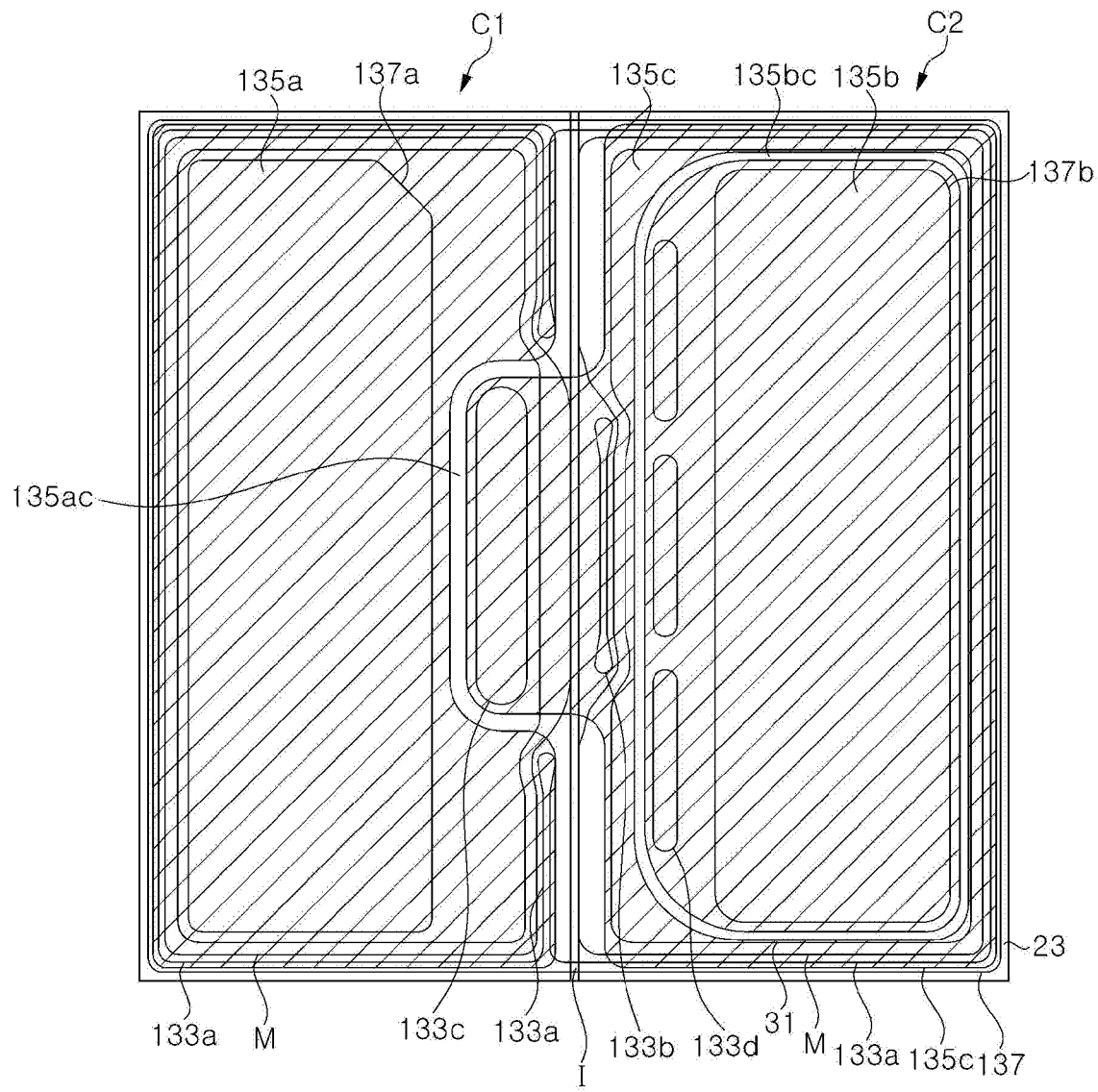
FIG. 10 is a schematic plan view illustrating a light emitting diode according to another embodiment of the inventive concepts.

FIG. 10 is a schematic plan view illustrating a light emitting diode according to another embodiment of the inventive concepts.

Referring to FIG. 10, the light emitting diode according to the present embodiment is substantially similar to the light emitting diode described with reference to FIGS. 8 and 9 except that an overall shape of the light emitting diode is different, and shapes of the openings 133a, 133b, and 133d of the lower insulation layer are different.

First, the first and second light emitting cells C1 and C2 have elongated rectangular shapes perpendicular to a direction where the first and second light emitting cells C1 and C2 are facing each other. Accordingly, the first pad metal layer 135a and the second pad metal layer 135b also have vertically long shapes along the shape of the light emitting cells.

Meanwhile, the lower insulation layer 133 has the first opening 133a exposing the first conductivity type semiconductor layer 23 along the outer side surface of the mesa M on the first light emitting cell C1 in the previous embodiments, but the first opening 133a extends along the inner side surface of the mesa M on the first light emitting cell C1 to further expose the first conductivity type semiconductor layer 23 in the present embodiment. In this case, the end terminal portion of the first opening 133a formed along the inner side surface of the first light emitting cell C1 may have a round shape with a wider width. The first opening 133a forms to expose the first conductivity type semiconductor layer 23 along the inner side surface of the mesa M, so that a contact area of the first pad metal layer 135a may increase, thereby improving current spreading capability.

The first opening 133b exposing the first conductivity type semiconductor layer 23 along the inner surface of the mesa M of the second light emitting cell C2 in the previous embodiment is formed along the isolation region I and is connected to the first opening 133a. In the present embodiment, however, the first opening 133b is separated from the first opening 133a. Further, both end terminal portions of the first opening 133b may have round shapes with a wider width.

Moreover, in the present embodiment, a plurality of second openings 133d of the lower insulation layer 133 may be formed.

Figure 11:
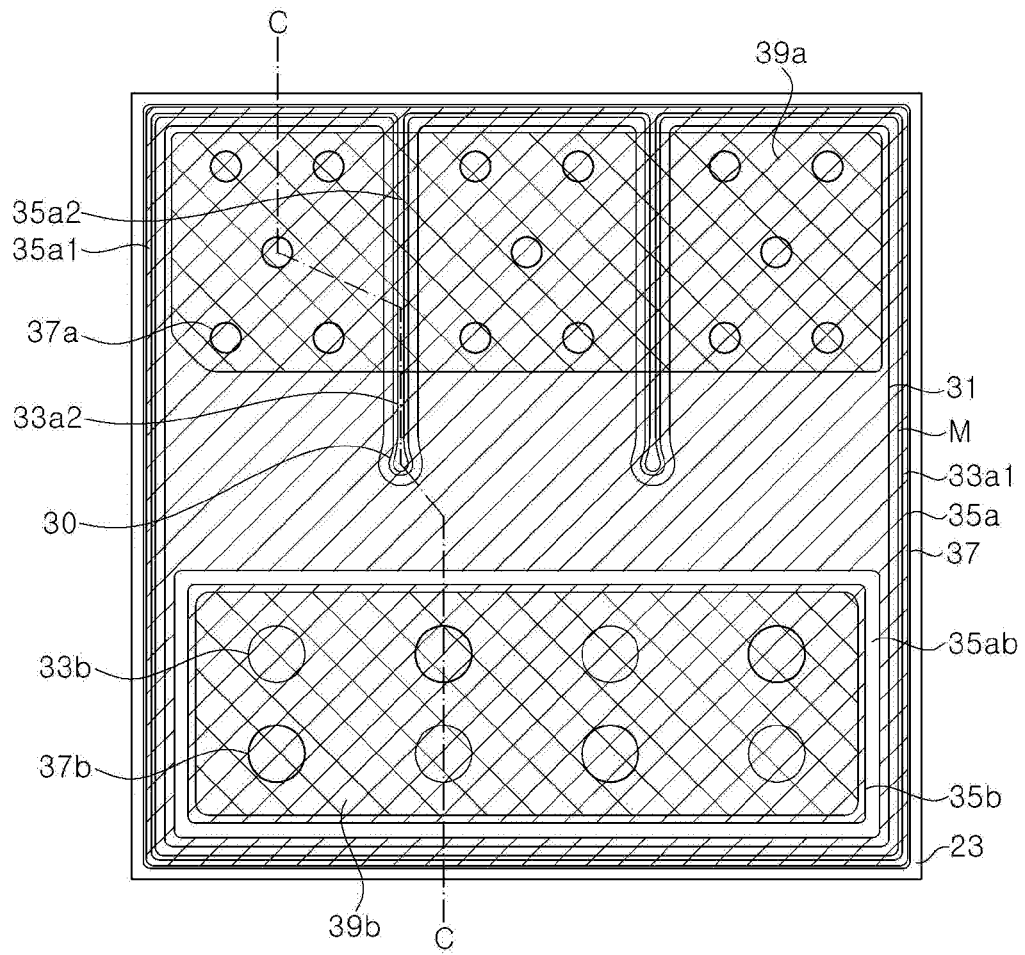
FIG. 11 is a schematic plan view illustrating a light emitting diode according to an exemplary embodiment of the inventive concepts.
Figure 12:
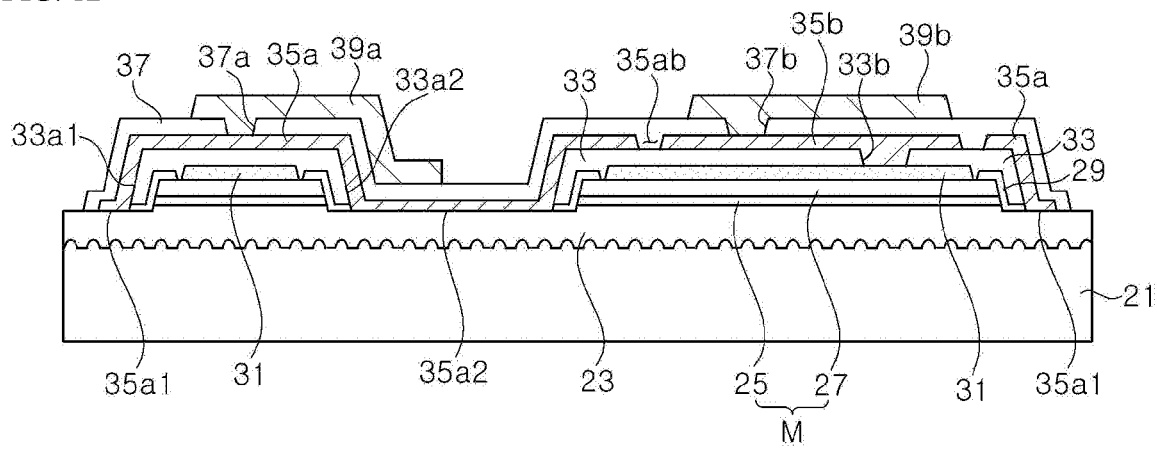
FIG. 12 is a cross-sectional view taken along the line C-C of FIG. 11.

FIG. 11 is a schematic plan view illustrating a light emitting diode according to an exemplary embodiment of the inventive concepts, and FIG. 12 is a cross-sectional view taken along the line C-C of FIG. 11.

Referring to FIGS. 11 and 12, the light emitting diode comprises a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, and an upper insulation layer 37. Furthermore, the light emitting diode may further comprise a preliminary insulation layer 29, and may further comprise a first bump pad 39a and a second bump pad 39b.

The substrate 21 may be selected from any substrates suitable for growth of gallium nitride semiconductor layers thereon. The substrate 21 may include, for example, a sapphire substrate, a gallium nitride substrate, a SiC substrate, and the like, and may be a patterned sapphire substrate. The substrate 21 may have a rectangular or square shape, as shown in the plan view of FIG. 1, without being limited thereto. The size of the substrate 21 is not particularly limited and may be selected in various ways.

The first conductivity type semiconductor layer 23 is disposed on the substrate 21. The first conductivity type semiconductor layer 23 may be a gallium nitride semiconductor layer grown on the substrate 21. The first conductivity type semiconductor layer 23 may be a gallium nitride semiconductor layer doped with an impurity, for example, Si.

A mesa M is disposed on each of first conductivity type semiconductor layers 23. The mesa M may be located within a region surrounded by the side surfaces of the first conductivity type semiconductor layer 23, and thus regions near edges of the first conductivity type semiconductor layer 23 are not covered by the mesa M, but are exposed to the outside.

The mesa M comprises a second conductivity type semiconductor layer 27 and an active layer 25. The active layer 25 is interposed between the first conductivity type semiconductor layer 23 and the second conductivity type semiconductor layer 27. The active layer 25 may have a single quantum well structure or a multiple quantum well structure. A composition and a thickness of the well layer in the active layer 25 determine a wavelength of generated light. In particular, by controlling the composition of the well layer, it is possible to provide an active layer generating ultraviolet light, blue light or green light.

Meanwhile, the second conductivity type semiconductor layer 27 may be a gallium nitride semiconductor layer doped with p-type dopants, for example, Mg. Each of the first conductivity type semiconductor layer 23 and the second conductivity type semiconductor layer 27 may be composed of a single layer or multiple layers and may include superlattice layers. The first conductivity type semiconductor layer 23, the active layer 25 and the second conductivity type semiconductor layer 27 may be grown on the substrate in a chamber by a well-known method, such as metal organic chemical vapor deposition (MOCVD) or molecular beam epitaxy (MBE).

As shown in FIG. 11, the mesa M may have an indent portion 30 intruding therein, and an upper surface of the first conductivity type semiconductor layer 23 may be exposed by the indent portion 30. The indent portion 30 may be formed long from one side edge of the mesa M toward the other side opposite to the mesa M. A length of the indent portion 30 is not particularly limited, and may be ½ of the length of the mesa M or longer than that. Also, although two indent portions 30 are shown in FIG. 11, the number of indent portion 30 may be one or three or more. Accordingly, as the number of indent portions 30 increases, the number of inner contact portions 35a2 of the first pad metal layer 35a, which will be described later, increases, thereby improving current spreading capability.

Meanwhile, the indent portion 30 has a round shape as a width becomes wider at an end terminal portion thereof. As the shape of the end terminal portion of the indent is formed as described above, the lower insulation layer 33 may be formed in a similar shape. In particular, in a case that the lower insulation layer 33 includes a distributed Bragg reflector, if a width of the distributed Bragg reflector is not widened at the end terminal portion as shown in FIG. 11, a severe double step is formed in a side wall of the distributed Bragg reflector, and the pad metal layer 35a is likely to be cracked as an inclination angle of the side wall becomes large. Accordingly, the lower insulation layer 33 may be formed to have a gentle inclination angle by forming the shape of the end terminal portion of the indent portion 30 and the shape of the end terminal portion of the first opening 33a2 of the lower insulation layer 33 as in the present embodiment, thereby improving yield of the light emitting diode.

The ohmic reflection layer 31 is disposed over the mesa M to contact the second conductivity type semiconductor layer 27. The ohmic reflection layer 31 may be disposed substantially over an entire area of the mesa M in an upper region of the mesa M. For example, the ohmic reflection layer 31 may cover 80% or more, further, 90% or more of the upper region of the mesa M.

The ohmic reflection layer 31 may include a metal layer having reflectivity and thus can reflect light generated from the active layer 25 and travelling to the ohmic reflection layer 31, toward the substrate 21. For example, the ohmic reflection layer 31 may be composed of a single reflection metal layer, but is not limited thereto. Alternatively, the ohmic reflection layer 31 may include an ohmic layer and a reflection layer. The ohmic layer may be a metal layer such as a Ni layer or a transparent oxide layer such as an ITO layer, and the reflection layer may be a metal layer having high reflectance such as an Ag or Al layer.

Meanwhile, a preliminary insulation layer 29 may cover the mesa M in a periphery of the ohmic reflection layer 31. The preliminary insulation layer 29 may be formed of $SiO_2$, and may cover a side of the mesa M and may further cover a partial region of the first conductivity type semiconductor layer 23. In another embodiment, the preliminary insulation layer 29 may be disposed only on the periphery of the ohmic reflection layer 31 in the upper region of the mesa M.

The lower insulation layer 33 covers the mesa M and the ohmic reflection layer 31. The lower insulation layer 33 may also cover the first conductivity type semiconductor layer 23 along a periphery of the mesa M, and may cover the first conductivity type semiconductor layer 23 in the indent portion 30 inside the mesa M. The lower insulation layer 33 covers side surfaces of the mesa M in particular.

Meanwhile, the lower insulation layer 33 has first and second openings 33a1 and 33a2 exposing the first conductivity type semiconductor layer 23 and a second opening 33b exposing the ohmic reflection layer 31. The first opening 33a1 exposes the first conductivity type semiconductor layer 23 along the periphery of the mesa M, and the first opening 33a2 exposes the first conductivity type semiconductor layer 23 in the indent portion 30. As shown in FIG. 11, the first opening 33a1 and the first opening 33a2 may be connected to each other. However, the inventive concepts are not limited thereto, but the first opening 33a1 and the first opening 33a2 may be separated from each other.

The second opening 33b exposes the ohmic reflection layer 31. A plurality of second openings 33b may be formed, and these second openings 33b may be disposed near one edge of the substrate 21 so as to face the indent portion 30. Locations of the second openings 33b will be described later.

Meanwhile, the lower insulation layer 33 covers the preliminary insulation layer 29 and is integrated with the preliminary insulation layer 29. Unless specifically stated, it should be understood that the preliminary insulation layer 29 is included in the lower insulation layer 33. The lower insulation layer 33 may be formed of a single layer of $SiO_2$ or $Si_3N_4$, without being limited thereto. For example, the lower insulation layer 33 may have a multilayer structure which includes a silicon oxide layer and a silicon nitride layer, and may include a distributed Bragg reflector in which silicon oxide layers and titanium oxide layers are alternately stacked one above another.

The first pad metal layer 35a is disposed on the lower insulation layer 33 and is insulated from the mesa M and the ohmic reflection layer 31 by the lower insulation layer 33. The first pad metal layer 35a contacts the first conductivity type semiconductor layer 23 through the first openings 33a1 and 33a2 of the lower insulation layer 33. The first pad metal layer 35a may include an outer contact portion 35a1 contacting the first conductivity type semiconductor layer 23 along the periphery of the mesa M and an inner contact portion 35a2 contacting the first conductivity type semiconductor layer 23 in the indent portion 30. The outer contact portion 35a1 contacts the first conductivity type semiconductor layer 23 near an edge of the substrate 21 along the periphery of the mesa M, and the inner contact portion 35a2 contacts the first conductivity type semiconductor layer 23 in a region surrounded by the outer contact portion 35a1. The outer contact portion 35a1 and the inner contact portion 35a2 may be connected to each other, but the inventive concepts are not limited thereto, and they may be separated from each other.

Meanwhile, the second pad metal layer 35b is disposed on the upper region of the mesa M on the lower insulation layer 33, and is electrically connected to the ohmic reflection layer 31 through the second opening 33b of the lower insulation layer 33. The second pad metal layer 35b may be surrounded by the first pad metal layer 35a, and a boundary region 35ab may be formed therebetween. The lower insulation layer 33 is exposed to the boundary region 35ab, and this boundary region 35ab is covered with the upper insulation layer 37, which will be described later.

The first pad metal layer 35a and the second pad metal layer 35b may be formed of the same material by the same process. The first and second pad metal layers 35a and 35b may include an ohmic reflection layer such as an Al layer, and the ohmic reflection layer may be formed on an adhesive layer such as Ti, Cr, or Ni. Furthermore, a protective layer of a single layer or a multiple layer structure such as Ni, Cr, Au, or the like may be formed on the ohmic reflection layer. The first and second pad metal layers 35a and 35b may have multilayer structures of Cr/Al/Ni/Ti/Ni/Ti/Au/Ti, for example.

The upper insulation layer 37 covers the first and second pad metal layers 35a and 35b. In addition, the upper insulation layer 37 may cover the first conductivity type semiconductor layer 23 along the periphery of the mesa M. However, the upper insulation layer 37 may expose the first conductivity type semiconductor layer 23 along the edge of the substrate 21.

Meanwhile, the upper insulation layer 37 has a first opening 37a exposing the first pad metal layer 35a and a second opening 37b exposing the second pad metal layer 35b. The first opening 37a and the second opening 37b may be disposed in the upper region of the mesa M and may be arranged to face each other. In particular, the first opening 37a and the second opening 37b may be disposed close to both side edges of the mesa M.

The second opening 33b of the lower insulation layer 33 described above may be disposed near the second opening 37b of the upper insulation layer 37. However, the second opening 33b of the lower insulation layer 33 is separated from the first opening 37a of the upper insulation layer 37 and also from the second opening 37b of the upper insulation layer 37 not to overlap with each other. Accordingly, even if a solder intrudes through the second opening 37b of the upper insulation layer 37, it is possible to prevent the solder from diffusing into the second opening 33b of the lower insulation layer 33, thereby preventing the contamination of the ohmic reflection layer 31 by the solder.

The upper insulation layer 37 may be formed of a single layer of $SiO_2$ or $Si_3N_4$, without being limited thereto. For example, the upper insulation layer 37 may have a multilayer structure which includes a silicon oxide layer and a silicon nitride layer, and may include a distributed Bragg reflector in which silicon oxide layers and titanium oxide layers are alternately stacked one above another.

Meanwhile, the first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 11, the first bump pad 39a covers and seals all of the first openings 37a of the upper insulation layer 37, and the second bump pad 39b covers and seals all of the second openings 37b of the upper insulation layer 37. Further, the second bump pad 39b covers an upper region of the second opening 33b of the lower insulation layer 33. That is, the second bump pad 39b covers the upper insulation layer 37 in the upper region of the second opening 33b of the lower insulation layer 33. The second bump pad 39b may cover all of the second openings 33b of the lower insulation layer 33, but the inventive concepts are not limited thereto, and a portion of the openings 33b may be disposed outside of the second bump pad 39b.

Further, as shown in FIG. 11, the second bump pad 39b may be disposed within an upper region of the second pad metal layer 35a, but the inventive concepts are not limited thereto, a portion of the second bump pad 39b may overlap with the first pad metal layer 35a. However, the upper insulation layer 37 may be disposed between the first pad metal layer 35a and the second bump pad 39b to insulate them.

Figure 13A:
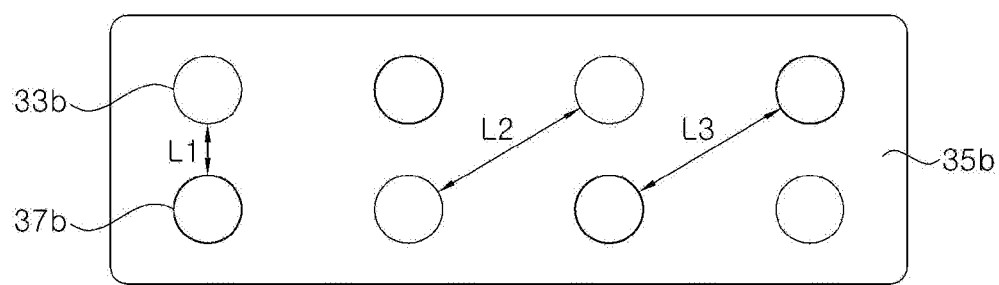
FIGS. 13A and 13B are schematic plan views illustrating openings of a lower insulation layer and an upper insulation layer in relation to the embodiment of FIG. 11.
Figure 13B:
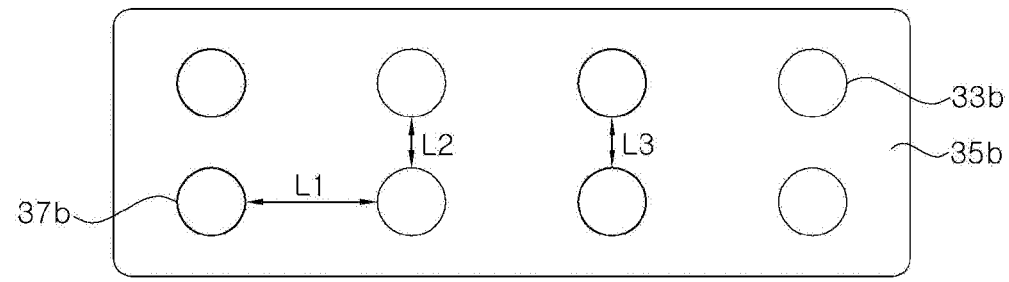

FIGS. 13A and 13B are schematic plan views illustrating the second openings 33b and 37b of the lower insulation layer and the upper insulation layer in relation to the embodiment of FIG. 11.

FIG. 13A shows the arrangement of second openings 33b of the lower insulation layer 33 and second openings 37b of the upper insulation layer 37 arranged in the same manner as the embodiment of FIG. 11, and FIG. 13B shows another modification.

Referring to FIGS. 13A and 13B, L1 represents a shortest distance between the second opening 33b and the second opening 37b, L2 represents a shortest distance between the second openings 33b, and L3 represents a shortest distance between the second openings 37b.

In FIG. 13A, the second openings 33b and the second openings 37b are alternately disposed at an upper side and a lower side, and the second openings 33b and the second openings 37b are alternately disposed in a lateral direction. In this arrangement, L1 is relatively short compared to L2 or L3. At least one of the second openings 37b is disposed between the second openings 33b.

In FIG. 13B, the same second openings 33b are disposed at an upper side and the same second openings 37b are disposed at a lower side, or vice versa, and the second openings 33b and the second openings 37b are alternately disposed in the lateral direction. In this arrangement, L1 is relatively long compared to L2 or L3. Also, at least one of the second openings 37b is disposed between the second openings 33b.

Considering the diffusion of the solder, it is advantageous to dispose the second opening 33b away from the second opening 37b. Therefore, the arrangement of FIG. 13B may be more advantageous than the arrangement of FIG. 13A.

In the drawings of FIGS. 13A and 13B, it is illustrated that the distance between the openings disposed at an upper side and a lower side is shorter than the distance between the openings disposed in the lateral direction. Alternatively, the distance between the openings disposed in the lateral direction may be shorter. In this case, in order to dispose the second opening 33b and the second opening 37b relatively farther apart, the second openings 33a and 37b are disposed vertically, the second openings 33b are continuously disposed laterally, and the second openings 37b are continuously disposed laterally, and thus it is more advantageous to prevent diffusion of the solder.

However, the number and the arrangement of the second openings 33b and the second openings 37b may be selected in consideration of an efficiency of current spreading and a symmetry of light emission pattern as well as contamination of the ohmic reflection layer 31 by the solder, and thus may variously modified.

Figure 14:
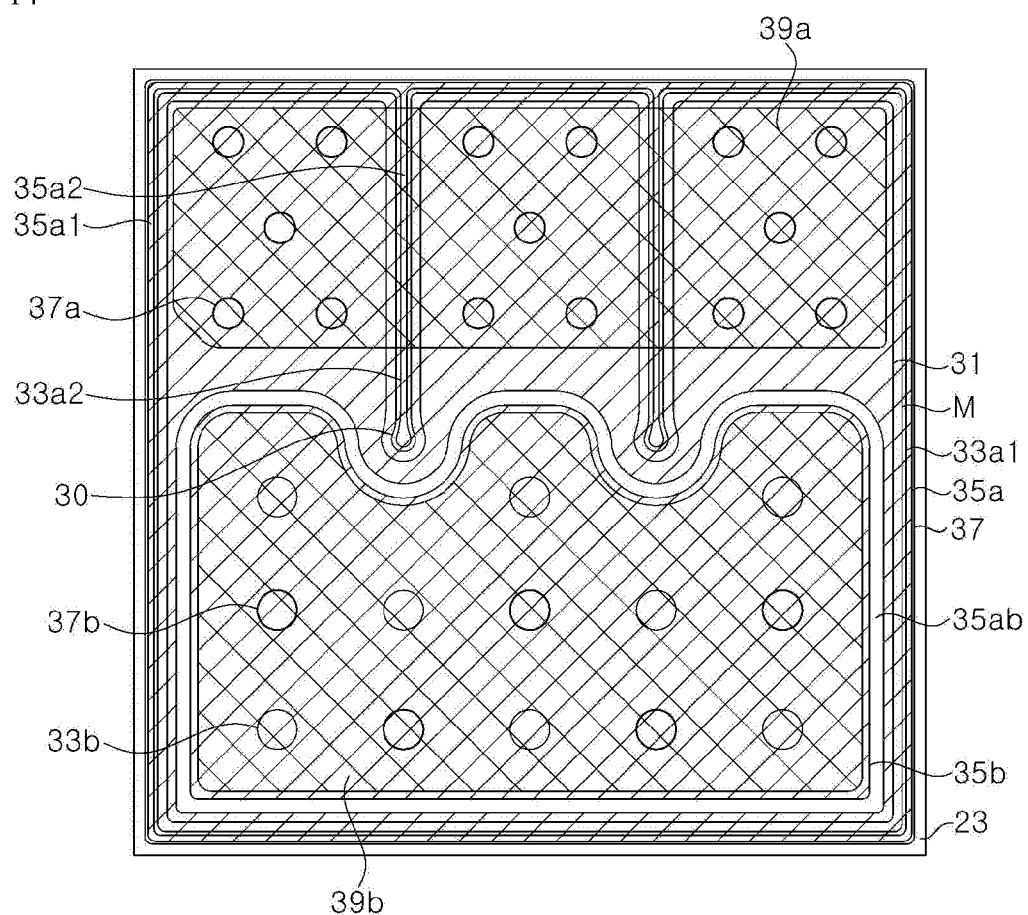
FIG. 14 is a schematic plan view illustrating a light emitting diode according to another embodiment of the inventive concepts.

FIG. 14 is a schematic plan view illustrating a light emitting diode according to another embodiment of the inventive concepts.

Referring to FIG. 14, the light emitting diode according to the present embodiment is substantially similar to the light emitting diode described with reference to FIGS. 11 and 1 except that shapes of the first pad metal layer 35a and the second pad metal layer 35b, an arrangement of the second opening 33b of the lower insulation layer 33, and a shape of the second bump pad 39b are different.

That is, the second openings 33b of the lower insulation layer 33 are added near the indent portion 30 in comparison with the embodiment of FIG. 11. The added second openings 33b are disposed closer to a center portion of the mesa M than an edge of the mesa M in which the second openings 37b of the upper insulation layer 37 are disposed. Although it is illustrated that the added second openings 33b are located apart from the center portion of the mesa M toward the edge side at which the second openings 37b of the upper insulation layer 37 are disposed. However, the inventive concepts are not limited thereto, the added second openings 33b may be disposed at the center portion of the mesa M or may be disposed apart from the center portion toward an edge side of the mesa M where the first bump pad 39a is disposed.

The second pad metal layer 35b is disposed to cover the second openings 33b. As shown in FIG. 14, the second pad metal layer 35b may have a concavoconvex shape having a concave portion near the indent portion 30. The first pad metal layer 35a may have a concavoconvex shape so that the boundary region 35ab between the first pad metal layer 35a and the second pad metal layer 35b has a constant width.

Meanwhile, the second bump pad 39b may have a shape similar to that of the second pad metal layer 35b, and may cover upper regions of the added second openings 33b.

According to the present embodiment, the second openings 33b of the lower insulation layer 33 may be distributed relatively widely, thereby helping to spread the current in the ohmic reflection layer 31.

Figure 15:
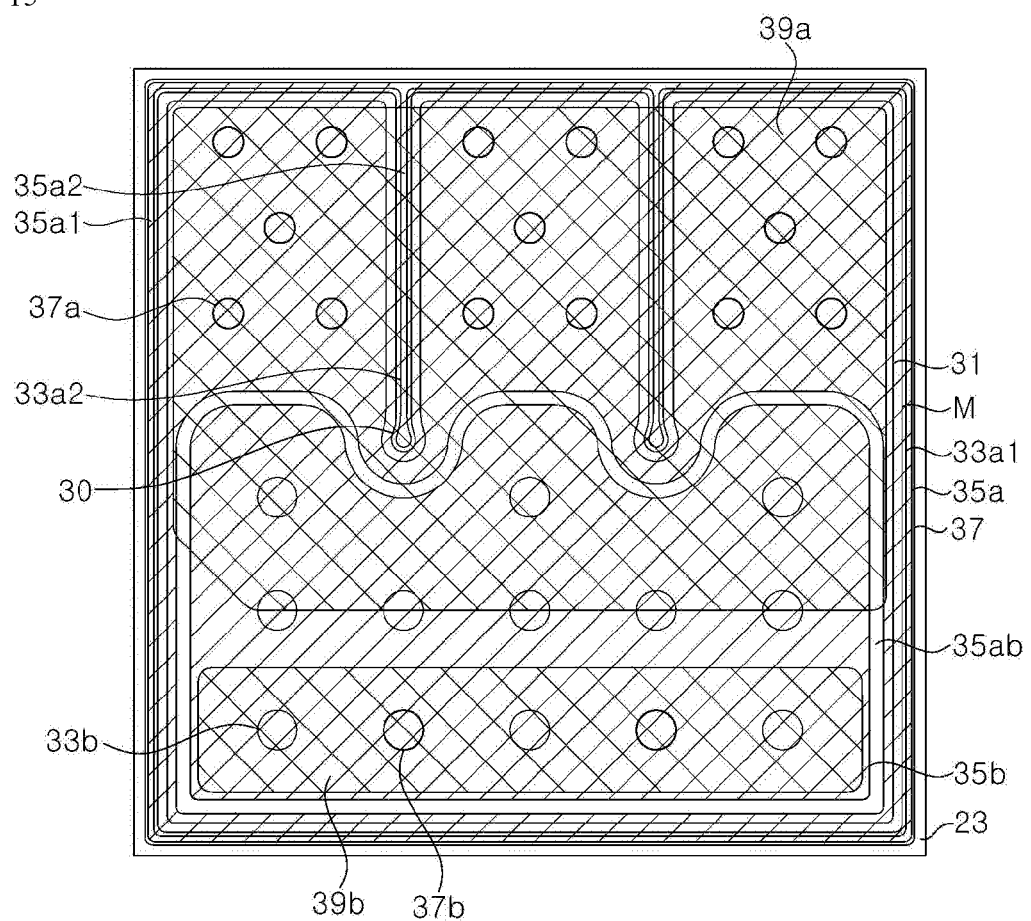
FIG. 15 is a schematic plan view illustrating a light emitting diode according to another embodiment of the inventive concepts.

FIG. 15 is a schematic plan view illustrating a light emitting diode according to another embodiment of the inventive concepts.

Referring to FIG. 15, the light emitting diode according to the present embodiment is substantially similar to the light emitting diode described with reference to FIG. 14 except that arrangements of the second openings 33b and the second openings 37b and shapes of the first and second bump pads 39a and 39b are different.

That is, the first bump pad 39a extends to an upper region of the second pad metal layer 35b, and covers at least a portion of the upper regions of the second openings 33b. However, the second openings 37b are separated from the first bump pads 39a and disposed outside of the first bump pads 39a. The second bump pad 39b may cover the second openings 37b and may also cover a portion of the second openings 33b.

In the present embodiment, the first bump pad 39a partially overlaps with the second pad metal layer 35b. Alternatively, the second bump pad 39b may partially overlap with the first pad metal layer 35a.

Figure 16:
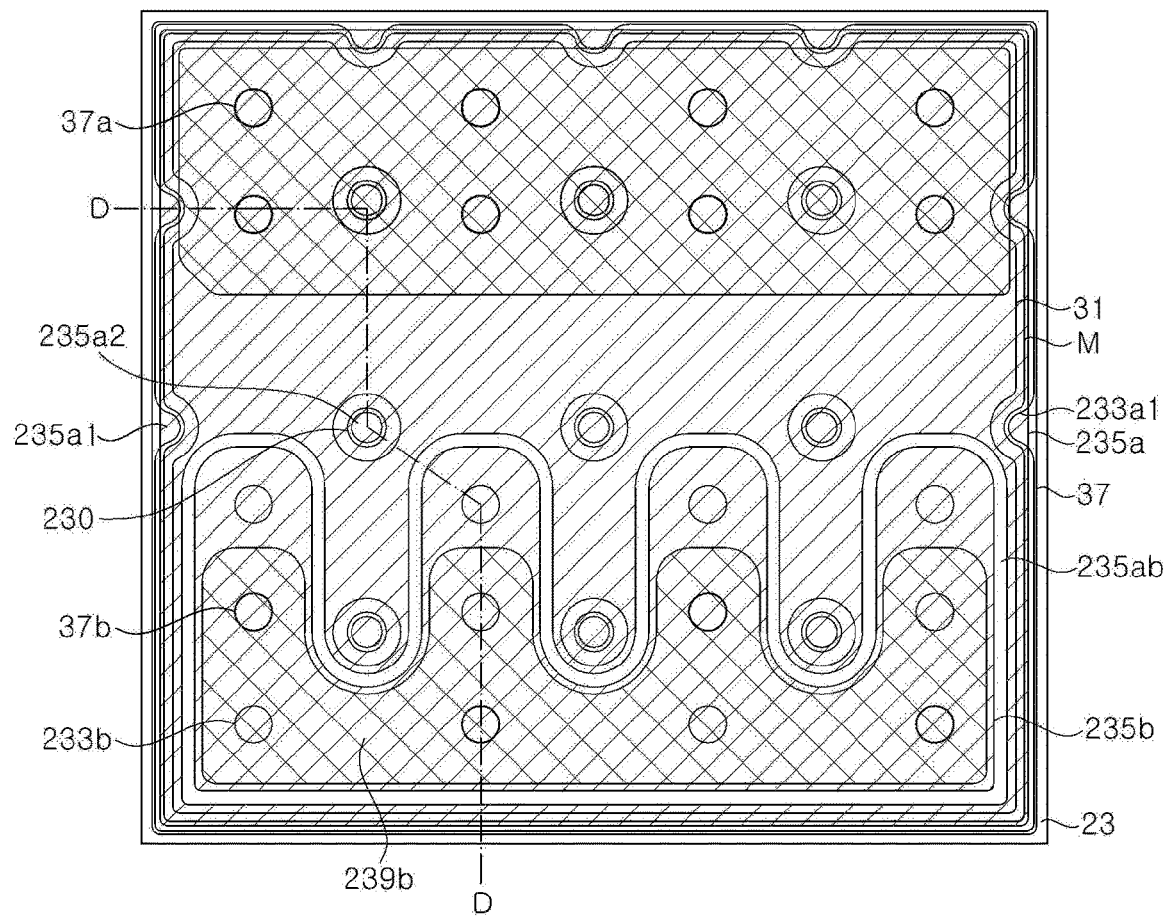
FIG. 16 is a schematic plan view illustrating a light emitting diode according to another embodiment of the inventive concepts.
Figure 17:
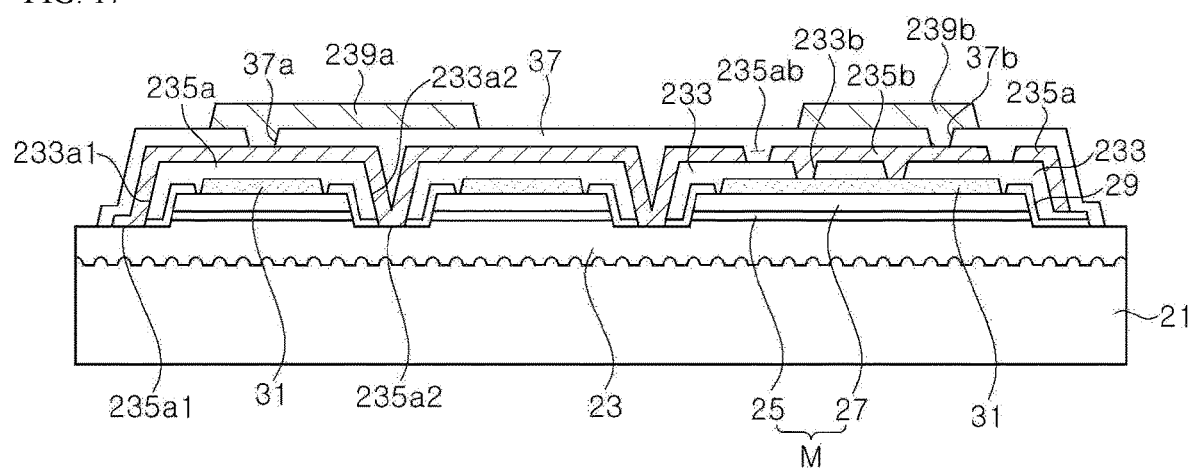
FIG. 17 is a cross-sectional view taken along the line D-D of FIG. 16.

FIG. 16 is a schematic plan view illustrating a light emitting diode according to another embodiment of the inventive concepts, and FIG. 17 is a cross-sectional view taken along the line D-D of FIG. 16.

Referring to FIGS. 16 and 17, the light emitting diode according to the present embodiment is substantially similar to the light emitting diode described with reference to FIGS. 11 and 12 except that a via hole is formed instead of the indent portion 30.

That is, the mesa M has a via hole 230 exposing the first conductivity type semiconductor layer 23 through the second conductivity type semiconductor layer 27 and the active layer 25. The via hole 230 is surrounded by the second conductivity type semiconductor layer 27 and the active layer 25. The mesa M may have a plurality of via holes 230 and the plurality of via holes 230 may be regularly arranged inside the mesa M. In FIG. 16, nine via holes 230 are shown, but the inventive concepts are not particularly limited thereto. Meanwhile, as shown in FIG. 16, concave portions may be formed in the mesa M along the edge of the mesa M.

The lower insulation layer 133 may cover the mesa M and the ohmic reflection layer 31, and may comprise a first opening 233a1 exposing the first conductivity type semiconductor layer 23 in an outside of the mesa M and a first opening 233a2 exposing the first conductivity type semiconductor layer 23 in the via hole 230. In addition, the lower insulation layer 233 has second openings 233b exposing the ohmic reflection layer 31 on the mesa M.

A first pad metal layer 235a comprises outer contact portions 235a1 contacting the first conductivity type semiconductor layer 23 through the first openings 233a1 of the lower insulation layer 233 and inner contact portions 235a2 contacting the first conductivity type semiconductor layer 23 through the first openings 233a2. The inner contact portions 235a2 may be evenly distributed in the mesa M for current spreading. Meanwhile, as shown in FIG. 16, the outer contact portions 235a1 may be distributed on three sides except one side of the mesa M, but the present disclosure is not limited thereto, the outer contact portions 235a1 may be distributed on four sides. Further, the outer contact portion 235a1 may be continuously formed along the mesa M as in the previous embodiments.

Meanwhile, a second pad metal layer 235b is electrically connected to the ohmic reflection layer 31 through the second openings 233b of the lower insulation layer 233. The second pad metal layer 235b is separated from the via holes 230. As shown in FIG. 16, the second openings 233b of the lower insulation layer 233 may be disposed in a region surrounded by the via holes 230, and the second pad metal layer 235b may cover the second openings 233b. Accordingly, the first pad metal layer 235a and the second pad metal layer 235b may be formed to have concavoconvex shapes.

The upper insulation layer 37 has a first opening 37a exposing the first pad metal layer 235a and a second opening 37b exposing the second pad metal layer 235b. The first openings 37a and the second openings 37b may be disposed near edges facing each other. In particular, the second openings 37b of the upper insulation layer 37 are separated from the second openings 233b of the lower insulation layer 233 not to overlap each other.

Meanwhile, the first bump pad 239a and the second bump pad 239b are electrically connected to the first pad metal layer 235a and the second pad metal layer 235b through the first and second openings 37a and 37b of the upper insulation layer 37, respectively.

As shown in FIG. 16, the second bump pad 239b may have a concavoconvex shape so as to surround the via holes 230. In addition, the second bump pad 239b may cover at least a portion of the second openings 233b of the lower insulation layer 233. As shown in FIG. 17, for example, the second bump pad 239b may cover an upper region of the second openings 233b of the lower insulation layer 233 except the second openings 233b disposed near the center portion of the mesa M. However, the inventive concepts are not limited thereto, the second bump pad 239b may cover the entire upper region of the second openings 233b.

Figure 18:
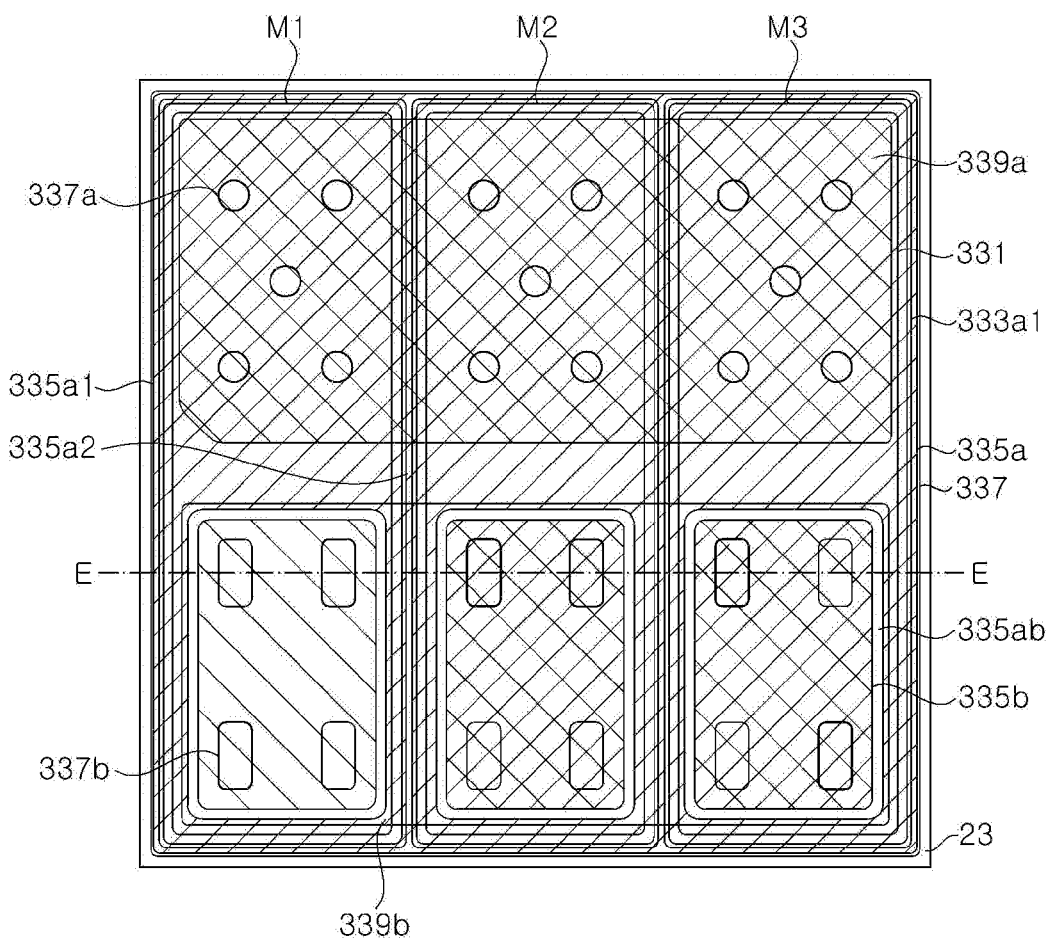
FIG. 18 is a schematic plan view illustrating a light emitting diode according to another embodiment of the inventive concepts.
Figure 19:
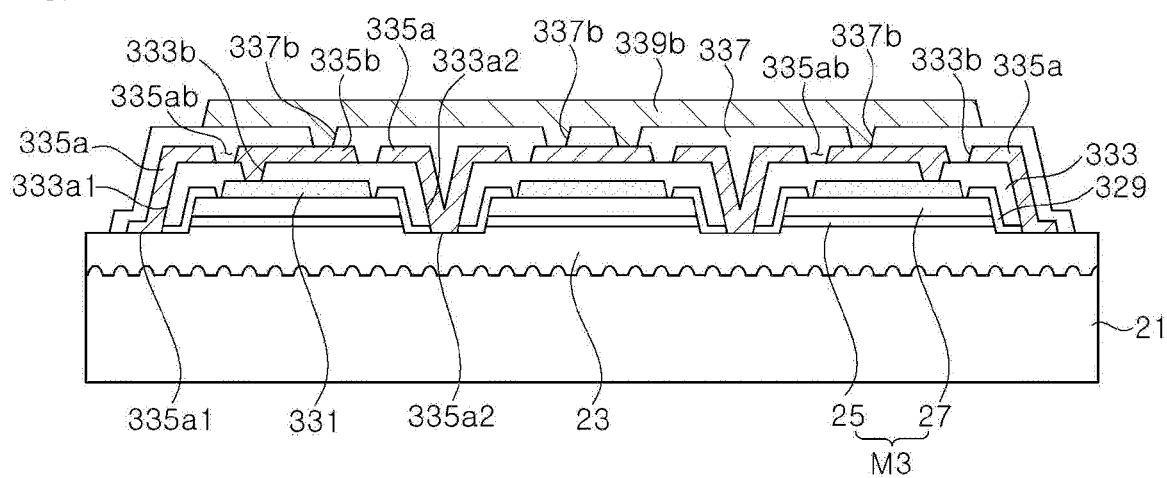
FIG. 19 is a cross-sectional view taken along the line E-E of FIG. 19.

FIG. 18 is a schematic plan view illustrating a light emitting diode according to another embodiment of the inventive concepts, and FIG. 19 is a cross-sectional view taken along the line E-E of FIG. 18.

Referring to FIGS. 18 and 19, the light emitting diode according to the present embodiment is substantially similar to the light emitting diode described with reference to FIGS. 11 and 12 except that the light emitting diode includes a plurality of mesas M1, M2, and M3.

That is, the light emitting diode in the embodiments in FIGS. 11 and 12 has a structure in which a single mesa M includes the indent portion 30 whereas the light emitting diode according to the present embodiment has a structure in which the mesas M1, M2, and M3 are disposed to be separated from each other. The mesas M1, M2, and M3 may be disposed to be flush with each other along a longitudinal direction. This structure corresponds to, for example, a structure in which the indent portion 30 is connected from one side edge to the other edge side in the embodiment of FIG. 11. As a result, shapes of the ohmic reflection layer 331 and the first and second pad metal layers 335a and 335b are modified.

The ohmic reflection layer 331 is located on each of the mesas M1, M2, and M3 and forms ohmic contact with each of the second conductivity type semiconductor layers 27. Each of the ohmic reflection layers 331 is disposed within upper regions of the mesas M1, M2, and M3, respectively, and is separated from each other.

Meanwhile, a preliminary insulation layer 329 may cover the mesas M1, M2, and M3 in a periphery of the ohmic reflection layer 331. The preliminary insulation layer 329 may be formed of $SiO_2$, and may cover sides of the mesas M1, M2, and M3, and may further cover a partial region of the first conductivity type semiconductor layer 23. In another embodiment, the preliminary insulation layer 329 may be disposed only on the periphery of the ohmic reflection layer 331 in the upper regions of the mesas M1, M2, and M3.

The lower insulation layer 333 covers the mesas M, M2, and M3 and the ohmic reflection layers 331. The lower insulation layer 333 has first openings 333a1 exposing the first conductivity type semiconductor layer 23 along an edge of the substrate 21 and first openings 333a2 exposing the first conductivity type semiconductor layer 23 between the mesas M1, M2, and M3.

In addition, the lower insulation layer 333 has second openings 333b exposing the ohmic reflection layer 331 on each of the mesas M1, M2, and M3. A shape of the second openings 333b may be circular in the same manner as in the embodiment of FIG. 11, but is not limited thereto, the shape of the second openings 333b may be a long rounded rectangular shape as shown in FIG. 18.

The first pad metal layer 335a covers the mesas M1, M2, and M3 and is electrically connected to the first conductivity type semiconductor layer 23 through the first openings 333a1 and 333a2. The first pad metal layer 335a may have an outer contact portion 335a1 to contact the first conductivity type semiconductor layer 23 through the first opening 333a1 and inner contact portions 335a2 between the mesas M1, M2, and M3 to contact the first conductivity type semiconductor layer 23 through the first openings 333a2.

Meanwhile, second pad metal layers 335b are disposed on the mesas M1, M2, and M3, respectively. Each of the second pad metal layers 335b may be surrounded by the first pad metal layer 335a, and thus a ring shaped boundary region 335ab may be formed on each of the mesas M1, M2, and M3.

The upper insulation layer 337 covers the first pad metal layer 335a and the second pad metal layer 335b, and has first openings 337a exposing the first pad metal layer 335a and second openings 337b exposing the second pas metal layer 335b. The second pad metal layers 335b on each of the mesas M1, M2, and M3 are exposed through the second openings 337b. The first openings 337a may also be disposed on each of the mesas M1, M2, and M3.

Meanwhile, a first bump pad 339a and a second bump pad 339b may be formed over the mesas M1, M2, and M3, respectively. The first bump pad 339a contacts the first pad metal layer 335a through the first openings 337a of the upper insulation layer 337, and the second bump pad 339b contacts the second pad metal layer 335b through the second openings 337b of the upper insulation layer 337. The second bump pad 339b may also cover an upper region of the second openings 333b of the lower insulation layer 333.

In the present embodiment, the second openings 333b of the lower insulation layer 333 and the second openings 337b of the upper insulation layer 337 may be arranged in various ways. In the present embodiment, the second openings 333b and 337b are arranged in the same number on the mesas M1, M2, and M3, and the second openings 333b and 337b are arranged over and under, and have a mirror symmetrical structure as a whole.

Figure 20A:
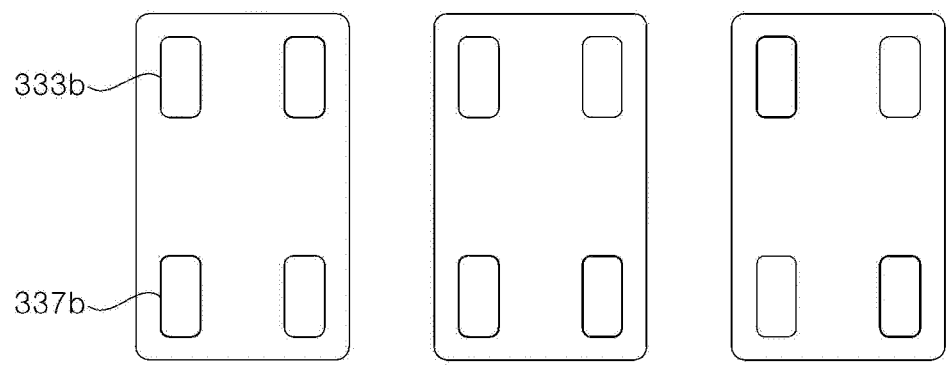
FIGS. 20A and 20B are schematic plan views illustrating openings of a lower insulation layer and an upper insulation layer in relation to the embodiment of FIG. 18.
Figure 20B:
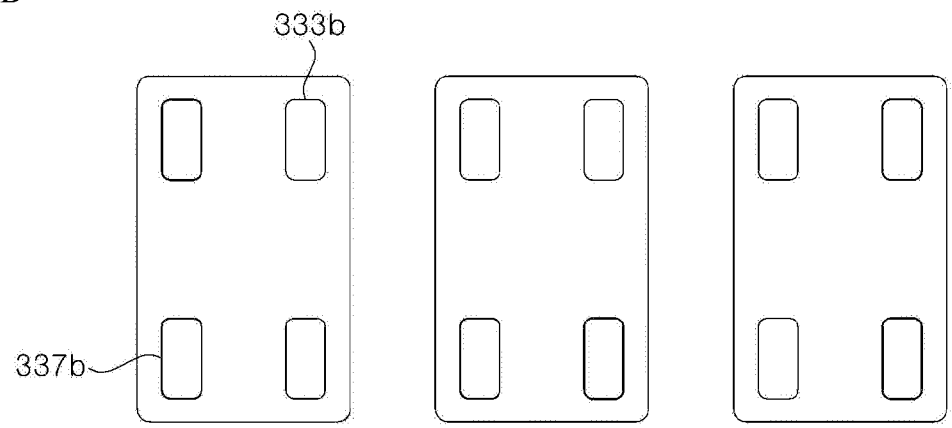

FIGS. 20A and 20B are schematic plan views illustrating various arrangements of the second openings 333b of the lower insulation layer 333 and the second openings 337b of the upper insulation layer 337.

Referring to FIG. 20A, the second openings 333b of the lower insulation layer 333 and the second openings 337b of the upper insulation layer 337 are disposed with their locations shifted from each other in comparison with the embodiment of FIG. 18. These openings 333b and 337b are also disposed to have the mirror symmetrical structure as a whole.

Referring to FIG. 20B, the second openings 333b of the lower insulation layer 333 are disposed over and under each other on the first mesa M1 and the third mesa M3, and the second openings 337b of the upper insulation layer 337 are also disposed over and under. Meanwhile, the second opening 333b and the second opening 337b are disposed over and under on the second mesa M2. In the embodiment of FIG. 20B, these openings 333b and 337b are also disposed to have the mirror symmetrical structure as a whole.

The second openings 333b and 337b disposed to have the mirror symmetrical structure, so that a symmetrical light emission pattern may be realized. However, the inventive concepts are not limited thereto, and arrangements of the openings 333b and 337b may be variously modified, and may not have the mirror symmetrical structure.

Figure 21:
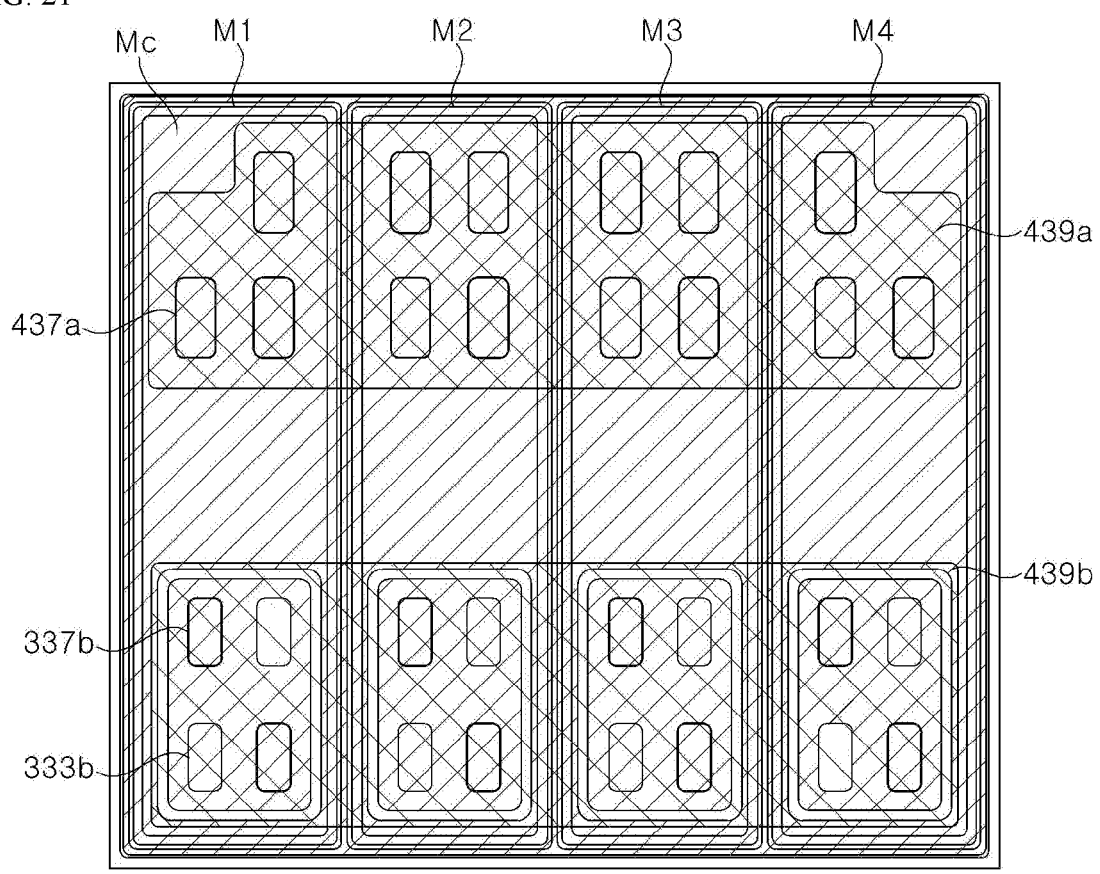
FIG. 21 is a schematic plan view illustrating a light emitting diode according to another embodiment of the inventive concepts.

FIG. 21 is a schematic plan view illustrating a light emitting diode according to another embodiment of the inventive concepts.

Referring to FIG. 21, the light emitting diode according to the present embodiment is substantially similar to the light emitting diode described with reference to FIGS. 18 and 19 except that the number of mesas and a shape of the first opening 437a of the upper insulation layer are different. To avoid the repeated contents described with reference to FIGS. 18 and 19, the detailed description thereof will be omitted, and the difference will be explained mainly.

In the present embodiment, four mesas M1 to M4 are disposed on the first conductivity type semiconductor layer 23. However, the number of mesas is not particularly limited, and may be more or less.

Meanwhile, the first openings 437a of the upper insulation layer may be circular as shown in FIG. 18, or may have a long rounded rectangular shape as shown in FIG. 21. The second opening 437b of the upper insulation layer may have the same shape, but sizes of the first opening 437a and the second opening 437b may be different from each other or may be the same.

By forming the shape of the first opening 437a with the long rounded rectangular shape, it is possible to secure a sufficient distance between the first openings 437a disposed laterally and adjacent to each other while increasing the size of the opening. Furthermore, the shape of the first opening 437a is not particularly limited thereto, but the shape may be variously modified.

Meanwhile, the second opening 337b of the upper insulation layer and the second opening 333b of the lower insulation layer are disposed vertically and laterally each other in the present embodiment. Unlike the embodiment of FIG. 18, the second opening 337b of the upper insulation layer and the second opening 333b of the lower insulation layer on each of the mesas M1 to M4 may be disposed in the same pattern in the present embodiment. Accordingly, an arrangement of the openings 333b and 337b is not mirror symmetrical. The arrangement of the openings 333b and 337b may be variously modified as described above with reference to FIGS. 20A and 20B. In addition, a shortest distance between the second opening 333b of the lower insulation layer and the second opening 337b of the upper insulation layer may be arranged to be greater than a shortest distance between the second openings 333b of the lower insulation layer or a shortest distance of the second openings 337b of the upper insulating layer.

A first bump pad 439a is formed over the mesas M1 to M4 and covers the first openings 437a of the upper insulation layer. The first bump pad 439a is connected to the first pad metal layer 335a as in the embodiment of FIG. 18. Meanwhile, a cathode mark Mc for displaying a cathode on the first bump pad 439a may be formed. For example, as shown in FIG. 21, a corner portion may be omitted from the first bump pad 439a having a rectangular shape to form the cathode mark Mc.

A second bump pad 439b is formed over the mesas M1 to M4 and covers the second openings 337b of the upper insulation layer. The second bump pad 439b is connected to the second pad metal layers 335b as in the embodiment of FIG. 18. The second bump pad 439b may also cover the upper region of the second openings 333b of the lower insulation layer.

Figure 22:
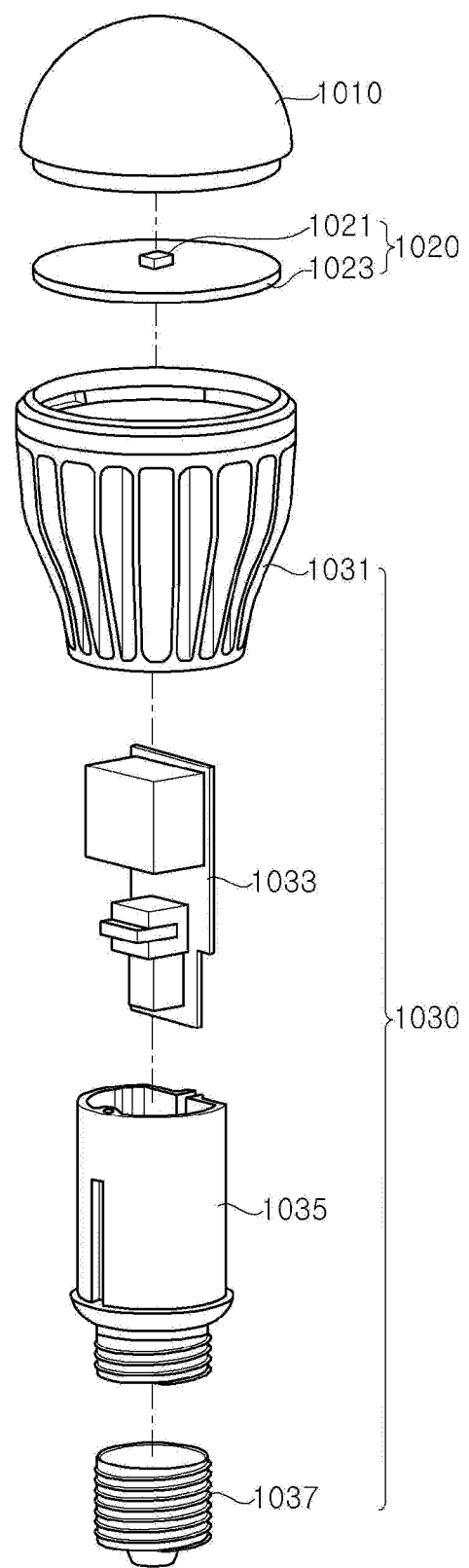
FIG. 22 is an exploded perspective view illustrating a lighting apparatus to which a light emitting diode according to an exemplary embodiment of the inventive concepts is applied.

FIG. 22 is an exploded perspective view illustrating a lighting apparatus to which a light emitting diode according to an exemplary embodiment of the inventive concepts is applied.

Referring to FIG. 22, the lighting apparatus according to the present embodiment includes a diffusive cover 1010, a light emitting diode module 1020, and a body 1030. The body 1030 may receive the light emitting diode module 1020 and the diffusive cover 1010 may be disposed on the body 1030 to cover an upper surface of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 23:
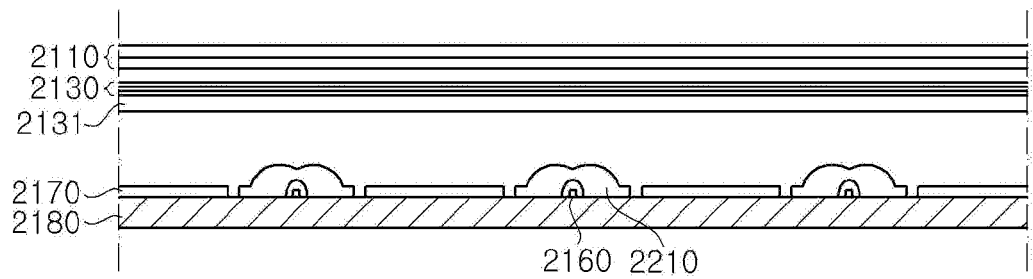
FIG. 23 is a cross-sectional view illustrating a display apparatus to which a light emitting diode according to another exemplary embodiment of the inventive concepts is applied.

FIG. 23 is a cross-sectional view illustrating a display apparatus to which a light emitting diode according to another exemplary embodiment of the inventive concepts is applied.

The display apparatus according to the present embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper surface thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to the present embodiment.

Figure 24:
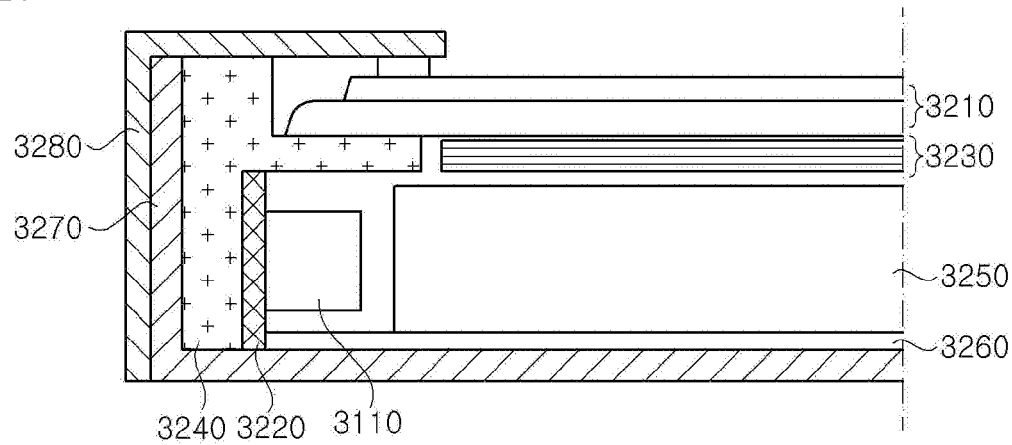
FIG. 24 is a cross-sectional view illustrating a display apparatus to which a light emitting diode according to another exemplary embodiment of the inventive concepts is applied.

FIG. 24 is a cross-sectional view illustrating a display apparatus to which a light emitting diode according to another exemplary embodiment of the inventive concepts is applied.

The display apparatus according to the present embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper surface thereof, a light source module disposed at one side inside the lower cover 3270, and a light guide plate 3250 disposed parallel to the light source module and converting spot light into sheet light. In addition, the backlight unit according to the present embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to the present embodiment.

Figure 25:
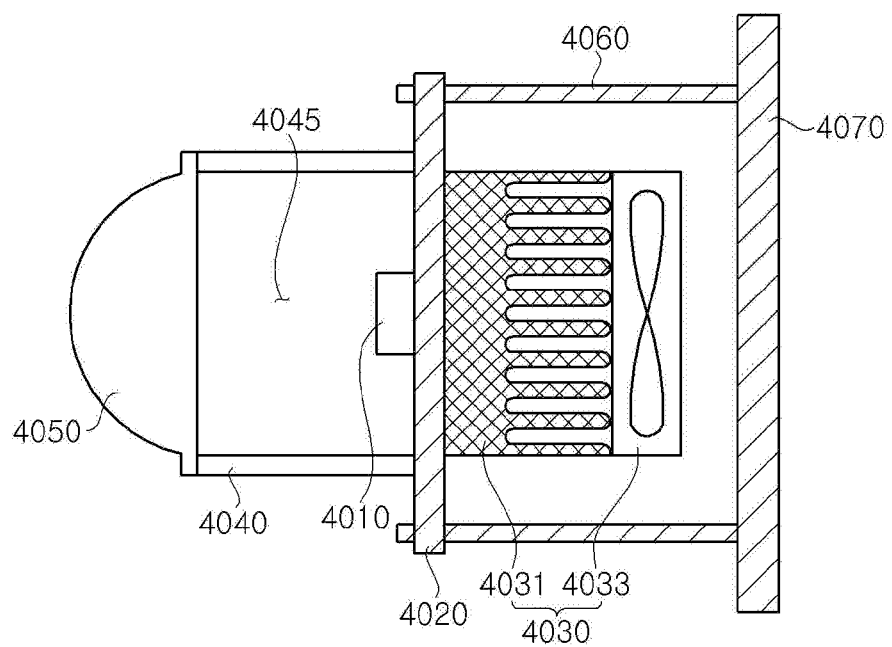
FIG. 25 is a cross-sectional view illustrating a head light to which a light emitting diode according to another exemplary embodiment of the inventive concepts is applied.

FIG. 25 is a cross-sectional view illustrating a head light to which a light emitting diode according to another exemplary embodiment of the inventive concepts is applied.

Referring to FIG. 25, the headlight according to the present embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights like the headlight according to the present embodiment, particularly, vehicular headlights.

Although the various exemplary embodiments of the inventive concepts have been described above, the inventive concepts are not limited to these embodiments, and various modifications can be made. In addition, the elements described in one embodiment can be applied to other embodiments without departing from the technical spirit according to the appended claims of the inventive concepts.

What is claimed:

1. A light emitting diode, comprising:
   a substrate;
   a first conductivity type semiconductor layer disposed on the substrate;
   a mesa disposed on the first conductivity type semiconductor layer, the mesa comprising an active layer and a second conductivity type semiconductor layer;
   an ohmic reflection layer disposed on the mesa and electrically connected to the second conductivity type semiconductor layer;
   a lower insulation layer covering the mesa and the ohmic reflection layer, the lower insulation layer comprising a first opening exposing the first conductivity type semiconductor layer and a second opening exposing the ohmic reflection layer;
   a first pad metal layer disposed on the lower insulation layer and electrically connected to the first conductivity type semiconductor layer through the first opening;
   a second pad metal layer disposed on the lower insulation layer, and electrically connected to the ohmic reflection layer through the second opening;
   an upper insulation layer covering the first pad metal layer and the second pad metal layer, the upper insulation layer comprising a first opening exposing the first pad metal layer and a second opening exposing the second pad metal layer; and
   first and second pump pads that cover the first and second pad metal layers exposed through the first and second openings of the upper insulation layer, respectively,
   wherein the second opening of the upper insulation layer is separated from the second opening of the lower insulation layer,
   wherein the second pad metal layer has a portion formed as a first groove in a plan view,
   wherein the first opening of the lower insulation layer is disposed on a first side of the first groove and the second opening of the lower insulation layer is disposed on a second side of the first groove,
   wherein the second bump pad has a portion formed as a second groove in the plan view, and
   wherein the first groove corresponds with the second groove.

2. The light emitting diode of claim 1,
   wherein a shortest distance from the second opening of the lower insulation layer to the second opening of the upper insulation layer is greater than a shortest distance from the second opening of the lower insulation layer to an edge of the second pad metal layer.

3. The light emitting diode of claim 1,
   wherein the first opening of the lower insulation layer is configured to expose the first conductivity type semiconductor layer along a periphery of the mesa, and
   wherein the first pad metal layer comprises an outer contact portion contacting the first conductivity type semiconductor layer along the periphery of the mesa.

4. The light emitting diode of claim 3,
   wherein the mesa comprises an indent portion configured to expose the first conductivity type semiconductor layer, wherein the first opening of the lower insulation layer is further configured to expose the first conductivity type semiconductor layer in the indent portion, and wherein the first pad metal layer further comprises an inner contact portion configured to contact the first conductivity type semiconductor layer in the indent portion.

5. The light emitting diode of claim 4, wherein the inner contact portion is connected to the outer contact portion.

6. The light emitting diode of claim 1, wherein the second opening of the lower insulation layer has a convex shape on a side facing the second opening of the upper insulation layer, and the second opening of the upper insulation layer has a concave shape corresponding to the convex shape of the second opening of the lower insulation layer.

7. The light emitting diode of claim 1, wherein the first and second bump pads cover and seal the first and second openings of the upper insulation layer, respectively.

8. The light emitting diode of claim 7, wherein the second bump pad also covers an upper insulation layer on an upper portion of the second opening of the lower insulation layer.

9. A light emitting diode, comprising:

a substrate;

a first conductivity type semiconductor layer disposed on the substrate;

a mesa disposed on the first conductivity type semiconductor layer, the mesa comprising an active layer and a second conductivity type semiconductor layer;

an ohmic reflection layer disposed on the mesa and electrically connected to the second conductivity type semiconductor layer;

a lower insulation layer covering the mesa and the ohmic reflection layer, the lower insulation layer comprising a first opening exposing the first conductivity type semiconductor layer and a second opening exposing the ohmic reflection layer;

a first pad metal layer disposed on the lower insulation layer and electrically connected to the first conductivity type semiconductor layer through the first opening;

a second pad metal layer disposed on the lower insulation layer, and electrically connected to the ohmic reflection layer through the second opening; and an upper insulation layer covering the first pad metal layer and the second pad metal layer, the upper insulation layer comprising a first opening exposing the first pad metal layer and a second opening exposing the second pad metal layer, wherein the second opening of the upper insulation layer is separated from the second opening of the lower insulation layer, and wherein the first and second pad metal layers exposed through the first and second openings of the upper insulation layer are bonding pads to which a solder is directly bonded.

* * * * *